US012620779B2

(12) United States Patent
Chen et al.

(10) Patent No.: US 12,620,779 B2
(45) Date of Patent: May 5, 2026

(54) VCSEL WITH SELF-ALIGNED MICROLENS TO IMPROVE BEAM DIVERGENCE

(71) Applicant: Taiwan Semiconductor Manufacturing Company, Ltd., Hsin-Chu (TW)

(72) Inventors: Jhih-Bin Chen, Hsinchu (TW); Ming Chyi Liu, Hsinchu City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 304 days.

(21) Appl. No.: 17/842,031

(22) Filed: Jun. 16, 2022

(65) Prior Publication Data

US 2022/0311214 A1 Sep. 29, 2022

Related U.S. Application Data

(62) Division of application No. 16/579,692, filed on Sep. 23, 2019, now Pat. No. 11,437,785.

(51) Int. Cl.
*H01S 5/183* (2006.01)
*H01S 5/0239* (2021.01)
(Continued)

(52) U.S. Cl.
CPC ........ *H01S 5/18388* (2013.01); *H01S 5/0239* (2021.01); *H01S 5/18313* (2013.01);
(Continued)

(58) Field of Classification Search
CPC ........... H01S 5/04257; H01S 2301/176; H01S 5/183–18397; H01S 5/02335; H01S 5/02345
See application file for complete search history.

(56) References Cited

U.S. PATENT DOCUMENTS

| | | | |
|---|---|---|---|
| 4,949,350 A | | 8/1990 | Jewell et al. |
| 5,559,053 A | * | 9/1996 | Choquette ........... H01S 5/18305 |
| | | | 148/DIG. 95 |

(Continued)

FOREIGN PATENT DOCUMENTS

| | | |
|---|---|---|
| CN | 108879324 A | 11/2018 |
| CN | 109842018 A | 6/2019 |
| JP | 2006073823 A | 3/2006 |

OTHER PUBLICATIONS

Kudelski, Jurek. "Devices and Photo Systems." Retrieved online on Jul. 24, 2019 from https://slideplayer.pl/slide/59119/ Published in 2014. * An English translation of each slide is included underneath each slide.

(Continued)

*Primary Examiner* — Sean P Hagan
(74) *Attorney, Agent, or Firm* — Eschweiler & Potashnik, LLC

(57) ABSTRACT

A method of making a microlens for a VCSEL device includes forming a first lens layer over a second reflector layer. The first lens layer has a first average concentration of a first element. A first additional reflector layer is formed over the first lens layer. A second lens layer is formed over the first additional reflector layer. The second lens layer has a second average concentration of the first element greater than the first average concentration. A second additional reflector layer is formed over the second lens layer.

An oxidation process is performed to oxidize peripheral portions of the first and second lens layers to form oxidized peripheral portions of the first and second lens layer. The oxidized peripheral portions of the second lens layer are wider than the oxidized peripheral portions of the first lens layer.

20 Claims, 20 Drawing Sheets

(51) Int. Cl.
*H01S 5/02* (2006.01)
*H01S 5/02335* (2021.01)
(52) U.S. Cl.
CPC ...... H01S 5/18333 (2013.01); H01S 5/18341 (2013.01); H01S 5/18377 (2013.01); *H01S 5/0217* (2013.01); *H01S 5/02335* (2021.01); *H01S 2301/176* (2013.01)

(56) References Cited

U.S. PATENT DOCUMENTS

| | | | |
|---|---|---|---|
| 5,633,527 A | 5/1997 | Lear | |
| 5,822,356 A | 10/1998 | Jewell | |
| 7,061,956 B2 | 6/2006 | Eitel | |
| 2001/0011733 A1* | 8/2001 | Mukai | H01L 21/02461 |
| | | | 257/70 |
| 2003/0067009 A1 | 4/2003 | Chua et al. | |
| 2003/0103542 A1 | 6/2003 | Cox et al. | |
| 2004/0129991 A1* | 7/2004 | Lai | H01L 31/0203 |
| | | | 257/433 |
| 2004/0233963 A1* | 11/2004 | Hooper | H01S 5/18344 |
| | | | 372/99 |
| 2005/0169571 A1* | 8/2005 | Kaneko | H01S 5/18313 |
| | | | 385/14 |
| 2015/0180207 A1 | 6/2015 | Kaneko et al. | |
| 2015/0380606 A1* | 12/2015 | Padullaparthi | H01S 5/18313 |
| | | | 438/40 |
| 2017/0070026 A1* | 3/2017 | Jogan | H10F 77/306 |
| 2020/0169062 A1 | 5/2020 | Yuen et al. | |

OTHER PUBLICATIONS

Freebody, Marie. "Lasers Evolve to Meet the Demands of Optical Communications." Photonics Spectra, published Feb. 2012.

Nikolov, I.D. "Nanofocusing Probe Limitations for a Ultra-High Density Optical Memory." Nanotechnology 15 (2004) 1076-1083, published on Jun. 25, 2004.

Ricoh. "Semiconductor Laser—High-Power VCSEL Module." The date of publication is unknown. Retrieved online on Jul. 8, 2019 from https://www.ricoh.com/technology/institute/research/tech_high_power_vcsel.html.

Sehgal, Meera. "VCSEL Market 2017-2024 Outlook Research Report by Decisiondatabases." Red Newswire, published on Jan. 19, 2018.

Wikipedia.org "Vertical-Cavity Surface-Emitting Laser." Published on Mar. 12, 2019.

Wikipedia.org "Wet Oxidation." Published on Jul. 20, 2018.

Choquette, Kent. "Advances in Selective Wet Oxidation of AlGaAs Alloys." IEEE Journal of Selected Topics in Quantum Electronics, vol. 3, No. 3, Jun. 1997.

Reed, Justin. What is a VCSEL? AMETEK. Published on Feb. 20, 2019.

Non-Final Office Action dated Aug. 17, 2021 for U.S. Appl. No. 16/579,692.

Notice of Allowance dated Mar. 1, 2022 for U.S. Appl. No. 16/579,692.

* cited by examiner

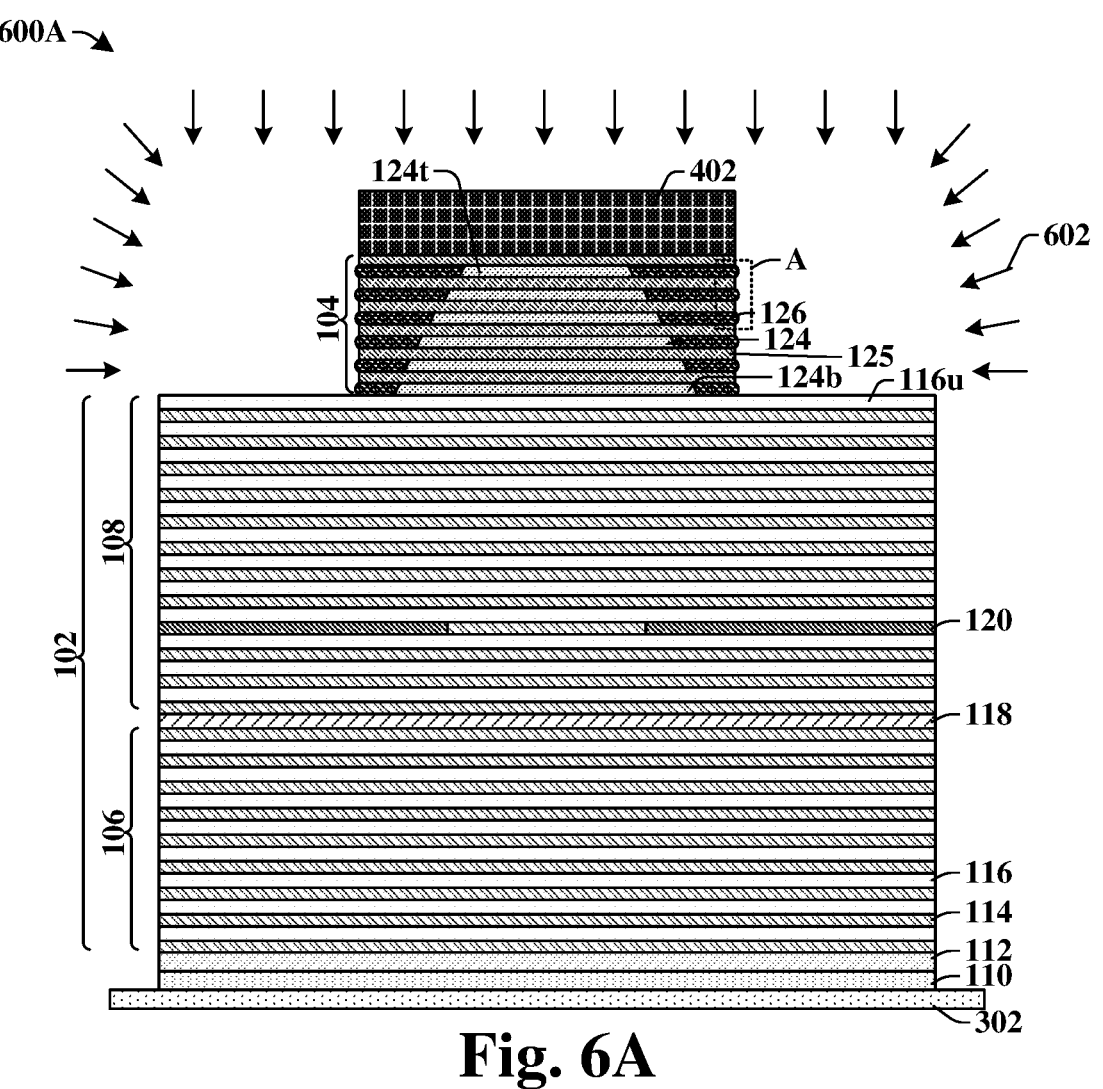
Fig. 6A
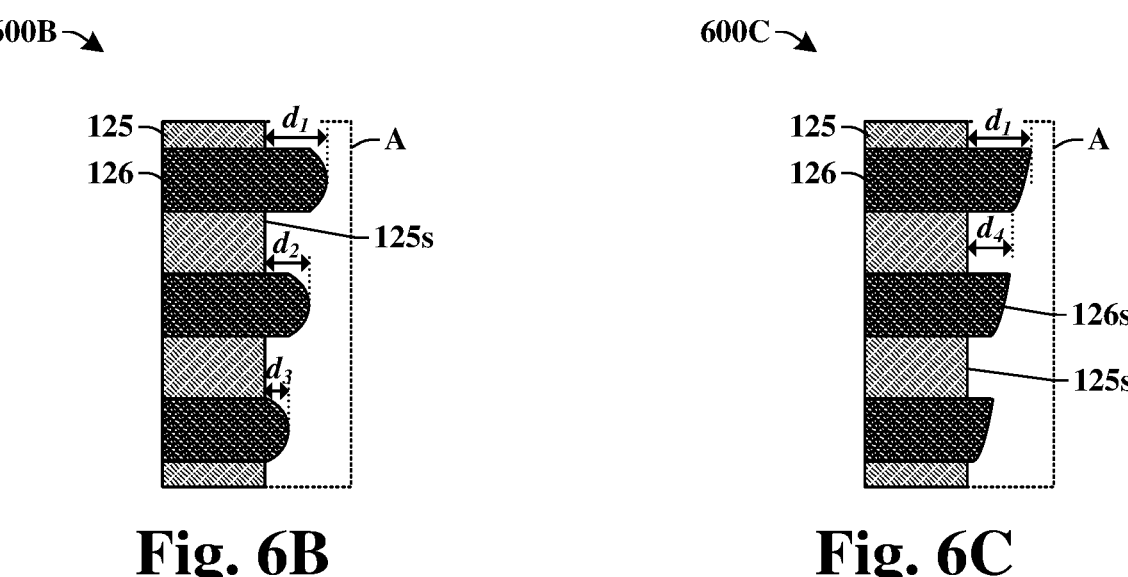
Fig. 6B           Fig. 6C

700

1700

2000

VCSEL WITH SELF-ALIGNED MICROLENS TO IMPROVE BEAM DIVERGENCE

REFERENCE TO RELATED APPLICATION

This Application is a Divisional of U.S. application Ser. No. 16/579,692, filed on Sep. 23, 2019, the contents of which are hereby incorporated by reference in their entirety.

BACKGROUND

Laser diodes are used in many kinds of modern day devices. A vertical cavity surface emitting laser (VCSEL) is one promising candidate for next generation laser diodes. Compared to current laser diodes, such as edge-emitting devices, the emission from a VCSEL is normal to the plane of the device, and therefore it can be processed using standard processing techniques. Furthermore, the advantageous emission from the VCSEL device allows for production of a large plurality of lasers on a single wafer.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3-19 illustrate cross-sectional views of some embodiments of a method of forming a self-aligned microlens for a VCSEL device using an oxidation process.

DETAILED DESCRIPTION

Figures 1A, 1B:
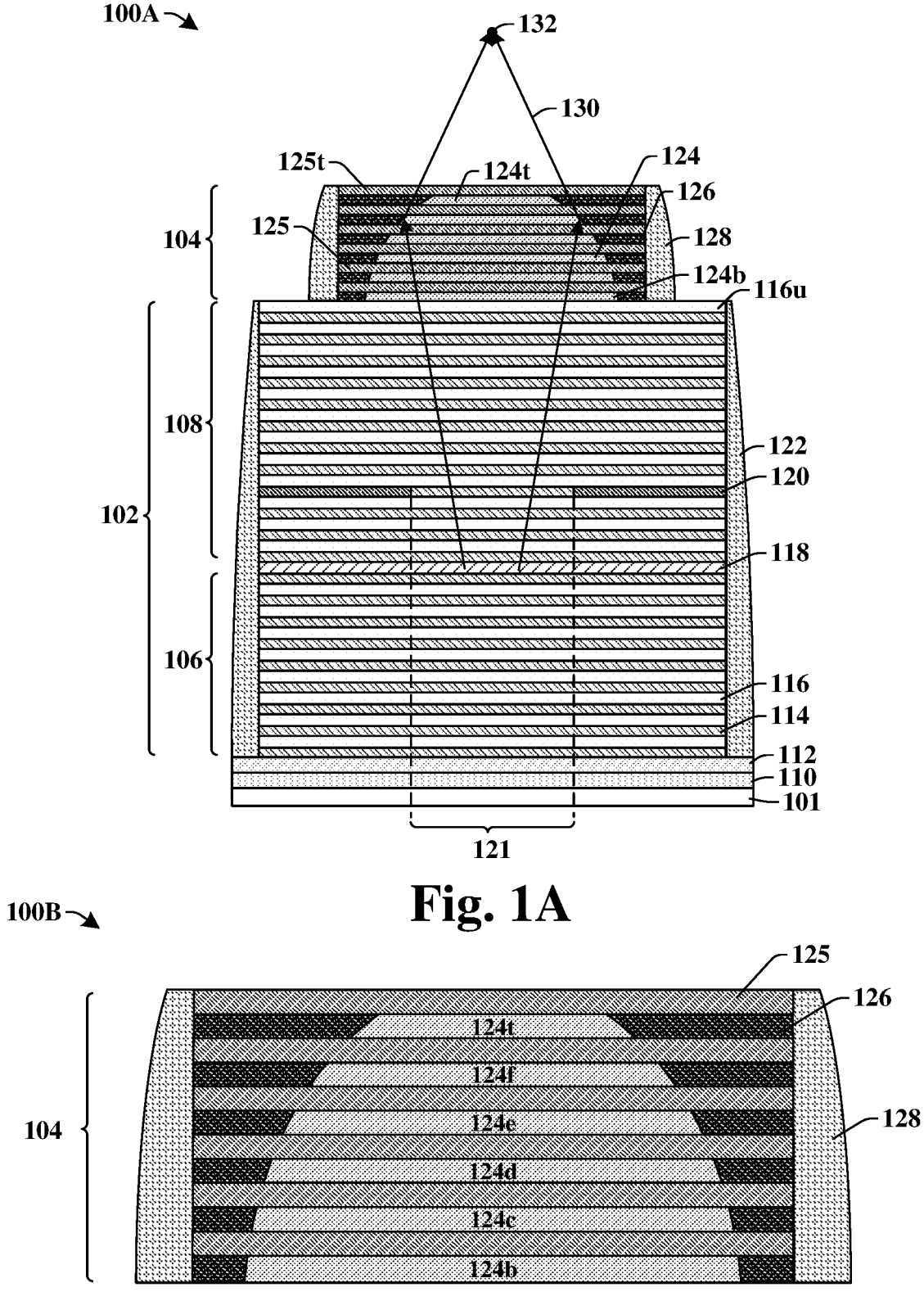
FIGS. 1A and 1B illustrate cross-sectional views of some embodiments of a VCSEL device having a self-aligned microlens comprising lens layers surrounded by oxidized lens layers.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A vertical cavity surface emitting laser (VCSEL) device includes distributed Bragg reflectors (DBR) stacks and an optically active region arranged between top and bottom electrodes. The DBR stacks comprise alternating first and second reflector layers. During operation of the VCSEL device, a bias may be applied across the top and bottom electrodes, which causes the optically active region to emit light. The light reflects multiple times through the first and second reflector layers, and due to the effects of interference, some patterns and/or frequencies of light are amplified by constructive interference while other patterns and/or frequencies are attenuated by destructive interference. In this way, after multiple reflections between the first and second reflector layers, light is directed through an optical aperture (e.g., an opening within an optically opaque material disposed within the DBR stack, an opening within a focusing material having a different refractive index than layers of the DBR stacks) and a focused laser is emitted through a microlens at a direction that is normal to the first and second reflector layers.

Typically, during the manufacturing of a VCSEL device, the microlens is manufactured separately from the DBR stacks, and is subsequently aligned and bonded to a top surface of the DBR stacks. The alignment of the microlens over the DBR stacks assures that the laser is focused when emitted. However, oftentimes, the precision of the alignment is difficult, and the microlens is misaligned over the DBR stacks. For example, in some embodiments, the optical aperture is within the DBR stacks to aid in the focus of the light, and the microlens may become misaligned with the optical aperture. Further, in some embodiments, the bonding of the microlens to the DBR stacks utilizes a bonding material (e.g., glue), which may interfere with (e.g., absorb, redirect, etc.) the focusing of the light. Thus, due to misalignment and/or the interface between the microlens and the DBR stacks, the emitted laser may be less powerful, defocused, and/or misdirected.

Various embodiments of the present disclosure relate to a self-align microlens process that forms an integrated microlens over DBR stacks. The method forms a microlens stack with additional first and second reflector layers over DBR stacks. The additional first reflector layers comprise a first element that is susceptible to oxidation (e.g., aluminum). Outer portions of the microlens stack are removed followed by an oxidation process that causes peripheral portions of the additional first reflector layers to oxidize and define lens layers laterally surrounded by oxidized lens layers. A topmost one of the additional first reflector layers oxidizes more than a bottommost one of the additional first reflector layers (because the topmost one of the first reflector layers has a higher concentration of the first element than the bottommost one of the first reflector layers) to give the lens layers a tapered shape. A difference in refractive indices between the lens layers and the oxidized lens layers causes the lens layers to collectively act as a lens that focuses radiation generated by the underlying DBR stacks. Sidewall spacers are subsequently formed along sides of the microlens stack followed by a second etch process that etches the DBR stacks according to the sidewall spacers. By etching the DBR stacks according to the sidewall spacers, the lens layers define a lens that is automatically aligned over the DBR stacks, thereby mitigating misalignment errors.

FIG. 1A illustrates a cross-sectional view 100A of some embodiments of a VCSEL device comprising a self-aligned microlens.

The VCSEL device in the cross-sectional view 100A includes a reflector stack 102 comprising a lower distributed Bragg reflectors (DBR) region 106 and an upper DBR region 108 spaced apart by an optically active region 118. In some embodiments, the reflector stack 102 may be disposed over a second conductive layer 112 over a first conductive layer 110 configured to electrically coupled the reflector stack 102 to one or more devices (e.g., transistors) within an underlying semiconductor substrate 101. The lower DBR region 106 and the upper DBR region 108 comprise a first plurality of stacked layers alternating between first reflector layers 114 and second reflector layers 116. In some embodiments, the lower DBR region 106, the upper DBR region 108, and the optically active region 118 have outermost sidewalls surrounded by lower sidewall spacers 122. In some embodiments, the DBR region 106 further comprises a focusing layer 120 laterally surrounding one or more of the first or second reflector layers 114, 116. The focusing layer 120 has sides that define an optical aperture 121 configured to direct reflected light towards a center of the reflector stack 102 due to a difference in refractive indices between the focusing layer 120, the first reflector layers 114, and the second reflector layers 116. In other embodiments, the focusing layer 120 may be omitted.

A microlens stack 104 is arranged over the upper DBR region 108. In some embodiments, the microlens stack 104 may be disposed onto an uppermost one 116u of the second reflector layers 116 within the reflector stack 102. The microlens stack 104 comprises a second plurality of stacked layers alternating between lens layers 124 and additional second reflector layers 125. In some embodiments, the additional second reflector layers 125 may be a same material as the second reflector layers 116, while in other embodiments the additional second reflector layers 125 may be a different material than the second reflector layers 116. In some embodiments, the additional second reflector layers 125 in the microlens stack 104 are narrower than the second reflector layers 116 in the reflector stack 102. The lens layers 124 are laterally surrounded by oxidized lens layers 126 having varying widths. The oxidized lens layers 126 have a different index of refraction than the lens layers 124. The oxidized lens layers 126 comprise the same material as the lens layers 124 with the addition of oxygen. For example, in some embodiments, the lens layer 124 may comprise aluminum gallium arsenic, while the oxidized lens layers 126 may comprise aluminum gallium arsenic oxide.

The lens layers 124 comprise a topmost lens layer 124t having a maximum width that is less than a maximum width of the bottommost lens layer 124b. Further, in some embodiments, the lens layers 124 may have outermost sidewalls that are curved. In other embodiments, the outermost sidewalls of the lens layers 124 may be slanted. Nevertheless, each lens layer 124 has a bottommost surface that is larger than a topmost surface, and may resemble a trapezoidal-like shape. Further, in some embodiments, the additional second reflector layers 125 may have a maximum width that is greater than that of the bottommost lens layer 124b.

In some embodiments, the lens layers 124, the additional second reflector layers 125, and the oxidized lens layers 126 in the microlens stack 104 may be surrounded by upper sidewall spacers 128. In some embodiments, a topmost surface of the microlens stack 104 may be a topmost one 125t of the additional second reflector layers 125, such that a focused laser may be emitted through the topmost one 125t of the additional second reflector layers 125. In some embodiments, the microlens stack 104 may be substantially centered over the optical aperture 121 of the focusing layer 120, such that the optical aperture 121 and the microlens stack 104 both direct light towards a center of the topmost lens layer 124t to emit a focused laser.

During operation, when a bias is applied across the reflector stack 102, light 130 (e.g., electromagnetic radiation) may be generated through by the optically active region 118 and reflect through the upper and lower DBR regions 108, 106 to emit a focused laser through the microlens stack 104 that is aligned with the optical aperture 121. As the light 130 enters into the microlens stack 104, the light 130 will intersect an interface between the lens layers 124 and the oxidized lens layers 126 at an angle of incidence. Because the lens layers 124 and the oxidized lens layers 126 have different indices of refraction, the light 130 will leave the interface at an angle of refraction defined according to Snell's law. The angled (e.g., curved) interfaces between the lens layers 124 and the oxidized lens layers 126 cause the light 130 to intersect the interfaces at different angles of incidence. The different angles of incidence cause light exiting the interface to have different angles of refraction that focus the light 130 at a focal point 132, such that the microlens stack 104 acts as a lens.

In some embodiments, the lens layers 124 comprise a same material as the first reflector layers 114, but different ones of the lens layers 124 has a varying and different concentrations of an oxidizable first element (e.g., aluminum, indium, iron, or the like) compared to the first reflector layers 114. Because of the varying concentration of the oxidizable first element within the different ones of the lens layers 124, an oxidation process can form the different ones of the lens layers 124 to have different widths (e.g., a higher concentration of the first element may indicate a higher oxidation rate that results in a narrower width lens layer 124). Furthermore, using the top sidewall spacers as a mask for the underlying reflector stack 102 allows for the lens layers 124 to be formed by a self-aligned process that is centered over the reflector stack 102. By forming the microlens stack 104 by a self aligned process, misalignment between the reflector stack 102 and the microlens stack 104 is eliminated. Further, the bottommost lens layer 124b may be in direct contact with the uppermost one 116u of the second reflector layers 116 in the upper DBR region 108 without a bonding material, such that a bonding material does not interfere with the light. Thus, the microlens stack 104 is self-aligned with the reflector stack 102 such that the VCSEL device in the cross-sectional view 100A emits a focused and reliable laser.

FIG. 1B illustrates a cross-sectional view 100B of some embodiments of the microlens stack 104 corresponding to FIG. 1A.

In some embodiments, the microlens stack 104 includes, for example, six of the lens layers 124 separated from one another by the additional second reflector layers 125. In other embodiments, the microlens stack 104 may include greater than or less than six lens layers 124. Further, in some embodiments, a ratio of the total number of lens layers 124 to the total number of additional second reflector layers 125 in the microlens stack 104 may be one to one.

In some embodiments, the lens layers 124 may comprise a first material or first composition, including a first element that is susceptible to oxidation, whereas the additional second reflector layers 125 may comprise a second material or second composition that includes the first material or first composition except without the first element. For example, in some embodiments, the lens layers 124 may comprise aluminum gallium arsenide, wherein the first element is aluminum, whereas the additional second reflector layers 125 comprise gallium arsenide. Further, in some embodiments, the oxidized lens layers 126 may comprise the first material with the addition of oxygen. For example, in some embodiments, the oxidized lens layers 126 comprise oxidized aluminum gallium arsenide (e.g., aluminum oxide gallium arsenide). In some embodiments, the lens layers 124 comprise a same material as the first reflector layers 114, but the lens layers 124 have a varying concentration of a first element compared to the first reflector layers 114. Thus, in some embodiments, the first reflector layers (114 of FIG. 1A) may also comprise the first material, such as aluminum gallium arsenide. In other embodiments, the first reflector layers (114 of FIG. 1A) may comprise a third material different from the first and second materials. For example, in some embodiments, the third material may include a III-V element combination, such as indium gallium arsenide. Similarly, in some embodiments, the second reflector layers (116 of FIG. 1A) may comprise the second material, thereby comprising a same material as the additional second reflector layers 125, whereas in other embodiments, the second reflector layers (116 of FIG. 1A) may comprise a fourth material different from the second material.

In some embodiments, each layer of the lens layers 124 in the microlens stack 104 may comprise a concentration gradient of the first element that increases from a bottom surface to a top surface of each lens layer 124. In some embodiments, each layer of the lens layers 124 may be equal or about equal in thickness and have a same change in concentration of the first element. However, in some embodiments, each layer of the lens layer 124 has a different average concentration of the first element, such that a topmost lens layer 124t comprises a higher average concentration of the first element than a bottommost lens layer 124b.

For example, in some embodiments, the bottommost lens layer 124b may have a minimum mole fraction of the first element equal to approximately 88 percent at a bottom surface and a maximum mole fraction of the first element equal to approximately 89 percent at a top surface. Further, in some embodiments, a second lens layer 124c may have a minimum mole fraction of the first element equal to approximately 89 percent at a bottom surface and a maximum mole fraction of the first element equal to approximately 90 percent at a top surface. Further, in some embodiments, a third lens layer 124d may have a minimum mole fraction of the first element equal to approximately 90 percent at a bottom surface and a maximum mole fraction of the first element equal to approximately 91 percent at a top surface. Further, in some embodiments, a fourth lens layer 124e may have a minimum mole fraction of the first element equal to approximately 91 percent at a bottom surface and a maximum mole fraction of the first element equal to approximately 92 percent at a top surface. Further, in some embodiments, a fifth lens layer 124f may have a minimum mole fraction of the first element equal to approximately 92 percent at a bottom surface and a maximum mole fraction of the first element equal to approximately 93 percent at a top surface. Further, in some embodiments, the topmost lens layer 124t may have a minimum mole fraction of the first element equal to approximately 93 percent at a bottom surface and a maximum mole fraction of the first element equal to approximately 94 percent at a top surface.

In other embodiments, the topmost lens layer 124t may have a maximum mole fraction of the first element that is up to 98 percent, for example. Nevertheless, in some embodiments, each layer of the lens layers 124 has a varying concentration of the first element from a bottom surface of each layer of the lens layers 124 to a top surface of each layer of the lens layers 124. By increasing the concentration of the first element that is susceptible to oxidation, a rate of oxidation increases from a bottom surface to a top surface of each layer of the lens layers 124. For example, in some embodiments, the topmost lens layer 124t has a top surface that has a highest rate of oxidation in the microlens stack 104, whereas the bottommost lens layer 124b has a bottom surface that has a lowest rate of oxidation in the microlens stack 104. Thus, because the lens layers 124 undergo a same oxidation process at a same time in the microlens stack 104, the topmost lens layer 124t oxidizes faster than the fifth lens layer 124f, the fourth lens layer 124e, the third lens layer 124d, the second lens layer 124c, and the bottommost lens layer 124b. The oxidation process may form the oxidized lens layers 126 that surround the lens layers 124. In some embodiments, the topmost lens layer 124t, due to its high oxidation rate, has the smallest maximum width compared to other lens layers 124 in the microlens stack 104. Because the bottommost lens layer 124b has the lowest rate of oxidation in the microlens stack 104, the bottommost lens layer 124b has the largest maximum width compared to other lens layers 124 in the microlens stack 104. In some embodiments, the additional second reflector layers 125 do not comprise the first element, and thus, do not undergo oxidation. Therefore, the additional second reflector layers 125 are wider than the lens layers 124 in the microlens stack 104. In some embodiments, a difference in length between a top surface and a bottom surface is increases from the bottommost lens layer 124b to the topmost lens layer 124t, which may be due to an exponential relationship between the concentration of the first element and the oxidation rate.

Further, because each layer of the lens layers 124 has an increasing concentration of the first element from a bottom surface to a top surface, outermost sidewalls of each layer of the lens layers 124 may be substantially curved. For example, in some embodiments, each layer of the lens layers 124 may have a top surface that is narrower than a bottom surface, and may have outermost sidewalls that are a continuous arc from the bottom surface to the top surface. Further, in some embodiments, with respect to a bottom surface of the lens layers 124, the outermost sidewalls of the lens layers 124 are concave down (e.g., have a slope that decreases with a distance from an underlying layer). In other embodiments, the outermost sidewalls of the lens layers 124 may be more linear than curved. Thus, in some embodiments, the lens layers 124 may together exhibit a semi-circle-like shape, whereas in other embodiments, the lens layers 124 may together exhibit a trapezoidal-like shape. In some embodiments, individually, the lens layers 124 may each exhibit a trapezoidal-like shape. The lens layers 124 together direct light and emit a focused laser through the topmost lens layer 124t.

Figure 2:
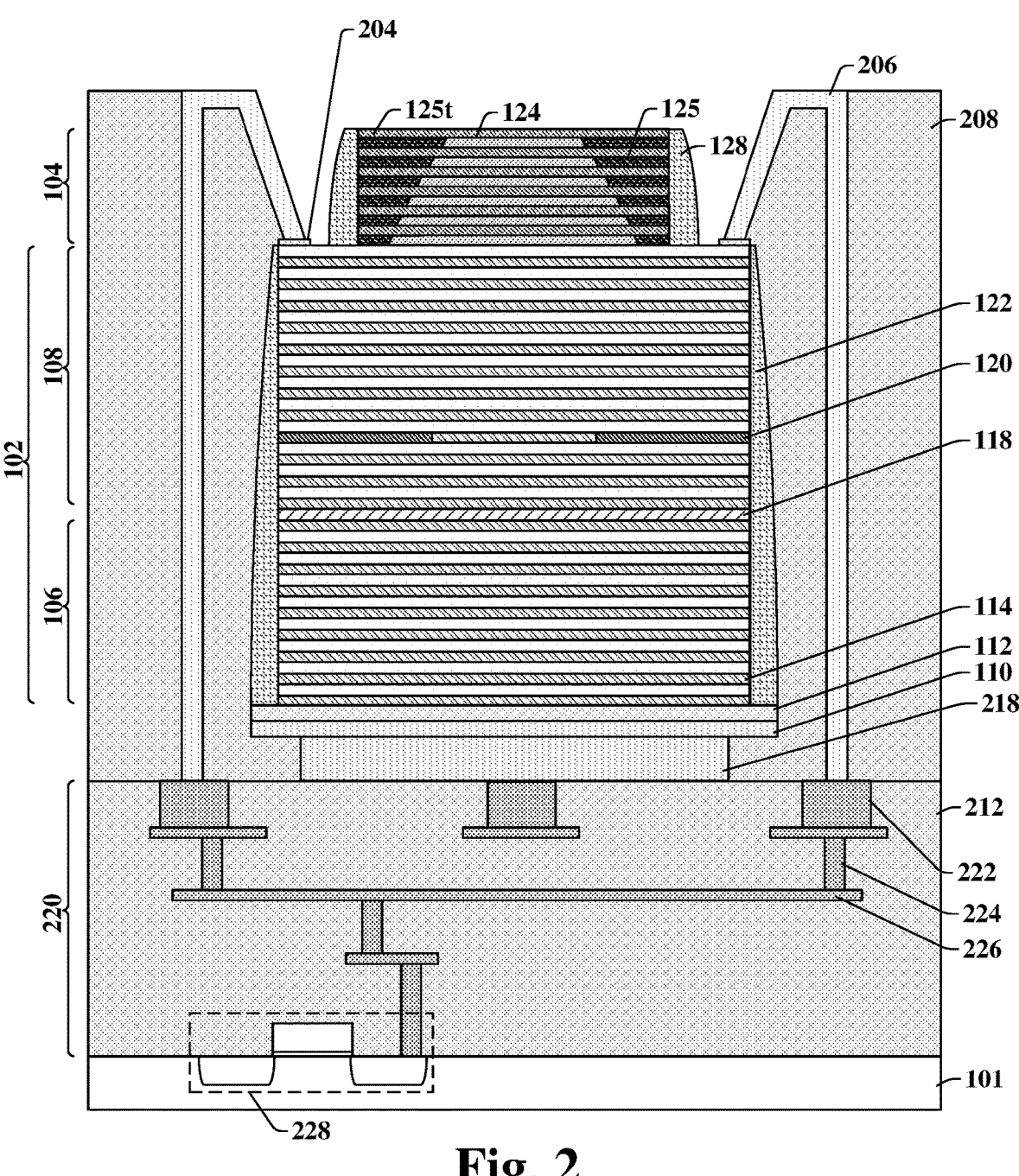
FIG. 2 illustrates a cross-sectional view of some additional embodiments of a VCSEL device having a self-aligned microlens coupled to a transistor.

FIG. 2 illustrates a cross-sectional view of some other embodiments of a VCSEL device 200 having a self-aligned microlens coupled to a transistor structure.

In some embodiments, a transistor 228 is disposed over a semiconductor substrate 101 and coupled to an interconnect structure 220. The transistor 228 may be a metal oxide semiconductor field-effect transistor (MOSFET), for example, and comprise a gate electrode overlying a gate dielectric, and source/drain regions disposed on opposite ends of the gate electrode. In some embodiments, the interconnect structure 220 comprises interconnect wires 226, interconnect vias 224, and contact pads 222 embedded within a lower inter-level dielectric (ILD) structure 212. In some embodiments, the first conductive layer 110 is bonded to a bottom electrode 218, and the bottom electrode 218 is coupled to one of the contact pads 222 and interconnect wires 226. The contact pads 222 and the interconnect wires 226 may couple the bottom electrode 218 to some other semiconductor device (e.g., transistor). In some embodiments, a top electrode contact 204 is coupled to the uppermost one 116u of the second reflector layers 116. In some embodiments, the top electrode contact 204 surrounds the microlens stack 104. The top electrode contact 204 may be coupled to the transistor 228 through conductive vias 206 and the interconnect structure 220. In some embodiments, the conductive vias 206 are disposed within an upper ILD structure 208. During operation, a bias may be applied across the reflector stack 102 through the bottom electrode 218 and the top electrode contact 204 to generate light within the optically active region 118.

FIGS. 3-19 illustrate cross-sectional views 300-1900 of some embodiments of a method of forming a VCSEL device comprising a self-aligned microlens. Although FIGS. 3-19 are described in relation to a method, it will be appreciated that the structures disclosed in FIGS. 3-19 are not limited to such a method, but instead may stand alone as structures independent of the method.

Figure 3:
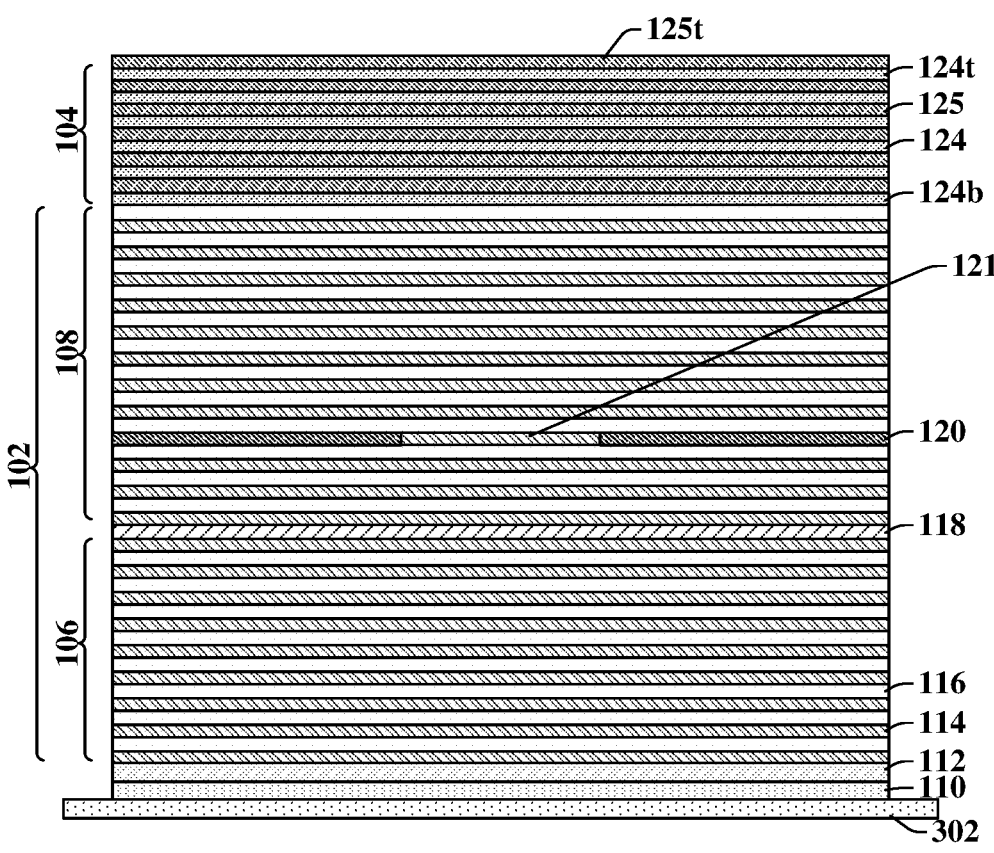

As shown in cross-sectional view 300 of FIG. 3, a second conductive layer 112 is formed over a first conductive layer 110 on a carrier substrate 302. In some embodiments, the second conductive layer 112 comprises a conductive material such as, for example, nickel, gold, copper, or the like, and the first conductive layer 110 may comprise a conductive material such as, for example, gold. Thus, in some embodiments, the first and second conductive layers 110, 112 may comprise a same material, whereas in other embodiments, the first and second conductive layers 110, 112 may comprise different materials. In some embodiments, the first conductive layer 110 may have a thickness in a range of between, for example, approximately 50 nanometers and approximately 800 nanometers. In some embodiments, the second conductive layer 112 may have a thickness in a range of between, for example, approximately 50 nanometers and approximately 500 nanometers.

In some embodiments, over the second conductive layer 112, a lower DBR region 106 is formed by alternatively forming a first reflector layer 114 and a second reflector layer 116. An optically active region 118 may be formed over the lower DBR region 106, and an upper DBR region 108 may be formed over the optically active region 118, such that the lower DBR region 106, the optically active region 118, and the upper DBR region 108 form a reflector stack 102. In some embodiments, each of the first reflector layers 114 and the second reflector layers 116 have a thickness in a range of between, for example, approximately 4 nanometers and approximately 100 nanometers. In some embodiments, the thickness of the first reflector layers 114 and the second reflector layers 116 are about equal.

In some embodiments, the first reflector layers 114 may each comprise a first material, such as, for example, aluminum gallium arsenide or indium gallium arsenide, whereas the second reflector layers 116 may comprise gallium arsenide. In some alternative embodiments, different ones of the first reflector layers 114 may comprise different materials, such as, for example, aluminum gallium arsenide and indium gallium arsenide. The first and second reflector layers 114, 116 may be formed, in some embodiments, through an epitaxial growth process. In some embodiments, the mole fraction of aluminum or indium in the first reflector layers 114 may be in a range of between approximately 40 percent and approximately 100 percent, for example. In some embodiments, each of the first reflector layers 114 in the reflector stack 102 may have a concentration of the first element (e.g., aluminum or indium) that is approximately the same. In some embodiments, the optically active region 118 may comprise the same material as the first reflector layers 114, except with an increased concentration in the first element (e.g., aluminum or indium). For example, in some embodiments, the optically active region 118 comprises at least 98 percent aluminum, and the remaining concentration of gallium and arsenide may be at most 2 percent. In some embodiments, the optically active region 118 may have a thickness in a range of between approximately 1 nanometer and approximately 20 nanometers. In some embodiments, the first and second reflector layers 114, 116 are transparent to allow the passage of light throughout the reflector stack 102.

In some embodiments, the reflector stack 102 may comprise a focusing layer 120 that defines an optical aperture 121 above the optically active region 118, and thus, within the upper DBR region 108. In other embodiments, the focusing layer 120 may be within the lower DBR region 106 and below the optically active region 118. In yet other embodiments, the focusing layer 120 may be omitted. In embodiments where the focusing layer 120 is present, the focusing layer 120 may surround one of the first and/or second reflector layers 114, 116 to guide reflected light through the optical aperture 121 in the focusing layer 120.

In some embodiments, a microlens stack 104 is formed over the reflector stack 102 and may comprise alternating layers of lens layers 124 and additional second reflector layers 125. In some embodiments, the additional second reflector layers 125 may comprise the same second material as the second reflector layers 116. In other embodiments, the additional second reflector layers 125 may comprise a different material than the second reflector layers 116. For example, in some embodiments, the additional second reflector layers 125 may comprise gallium arsenide, whereas the second reflector layers 116 may comprise indium arsenide. In some embodiments, the lens layers 124 comprise the same first material as the first reflector layers 114. The lens layers 124 may also be transparent to allow the passage of reflected light. In other embodiments, the lens layers 124 may comprise a different material than the first reflector layers 114. For example, in such embodiments, the lens layers 124 may comprise aluminum gallium arsenide with a varying concentration of aluminum, whereas the first reflector layers 114 comprise indium gallium arsenide. The first element (e.g., aluminum) in the lens layers 124 may be susceptible to oxidation to form an oxide (e.g., aluminum oxide). Nevertheless, the lens layers 124 each have an equal thickness in a range of between approximately 4 nanometers and approximately 100 nanometers, for example, in some embodiments. The concentration of aluminum in the lens layers 124 may vary in a range of between approximately 60 percent and approximately 100 percent. The lens layers 124 may also be formed by epitaxial grown, for example, such that the lens layers 124, the additional second reflector layers 125, and the first reflector layers 114 are formed using a same process method (e.g., epitaxial growth) without the use of a bonding material between the reflector stack 102 and the microlens stack 104.

In some embodiments, each of the lens layers 124 may have a different average concentration of the first element from one another. The average concentration of each of the lens layers 124 may increase from a bottommost lens layer 124b to a topmost lens layer 124t. Each individual lens layer 124 may also have a concentration gradient of the first element that increases from a bottom surface of each lens layer 124 to a top surface of each lens layer 124. The change in concentration between a bottom surface and a top surface of each lens layer 124 may be equal amongst each lens layer 124. For example, in some embodiments, the bottommost lens layer 124b and the topmost lens layer 124t may each have a change in concentration over its thickness of approximately 2 percent, for example. In some embodiments, the concentration of the first element (e.g., aluminum) may be adjusted by adjusting the associated source material for the first element during the epitaxial growth process. In some embodiments, a topmost layer of the microlens stack 104 may comprise a topmost one 125t of the additional second reflector layers 125.

In some embodiments, the change in concentration of the first element in the lens layers 124 may change the refractive index in the lens layers 124. For example, in some embodiments, the lens layers 124 may comprise aluminum gallium arsenide, wherein aluminum is the first element. The refractive index for aluminum gallium arsenide may be in a range of between approximately 3.0 and approximately 3.5. A high concentration of aluminum in aluminum gallium arsenide corresponds to a low refractive index, whereas a low concentration of aluminum in aluminum gallium arsenide corresponds to a high refractive index. Thus, as the concentration of aluminum increases from a bottom surface of each lens layer 124 to a top surface of each lens layer 124, the refractive index may decrease from a bottom surface of each lens layer 124 to a top surface of each lens layer 124.

Figure 4:
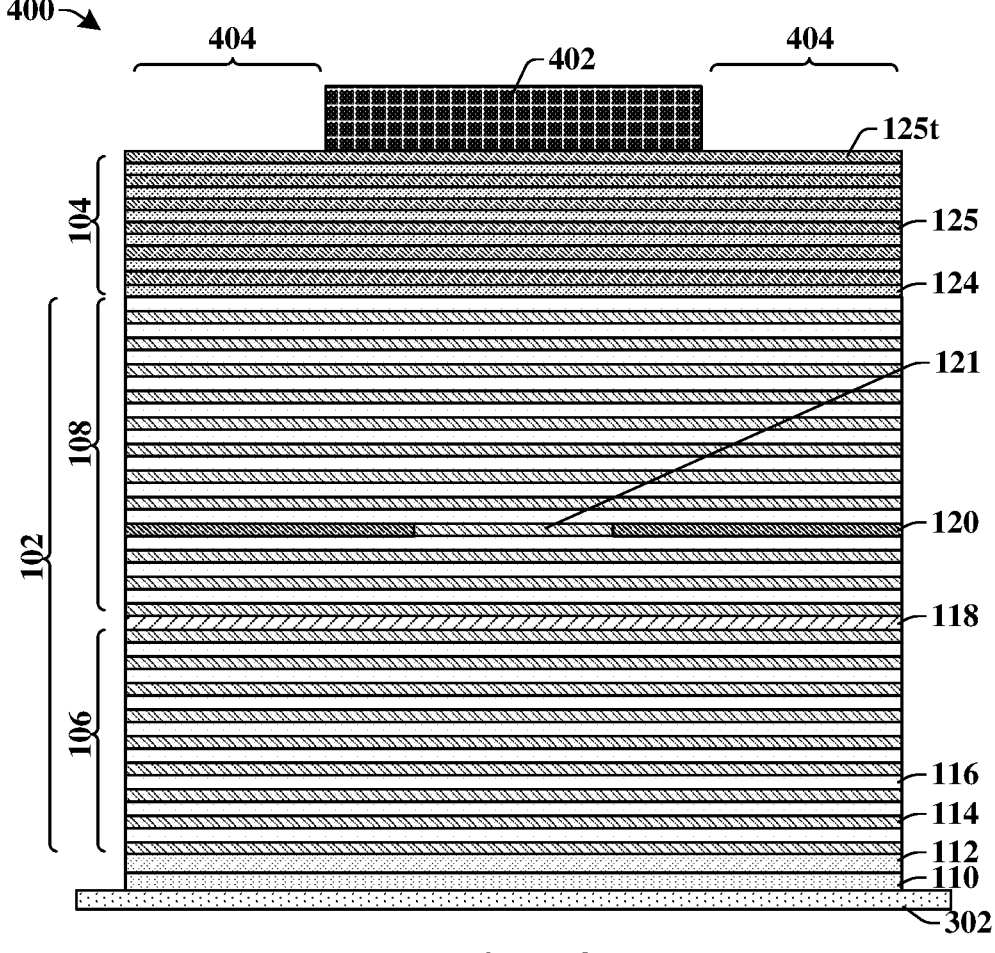

As shown in cross-sectional view 400 of FIG. 4, a masking layer 402 may be formed over the topmost one 125t of the additional second reflector layers 125. In some embodiments, the masking layer 402 may comprise a photosensitive material (e.g., photoresist) formed by a spin coating process. Using photolithography, the photosensitive material may be patterned to form the masking layer 402 over a center region of the microlens stack 104 and the reflector stack 102. In some embodiments, the masking layer 402 is centered over the optical aperture 121 in the focusing layer 120, and outer portions 404 of the microlens stack 104 are uncovered. In some embodiments, the masking layer 402 may comprise a photoresist, or some other polymer, that is clear.

Figure 5:
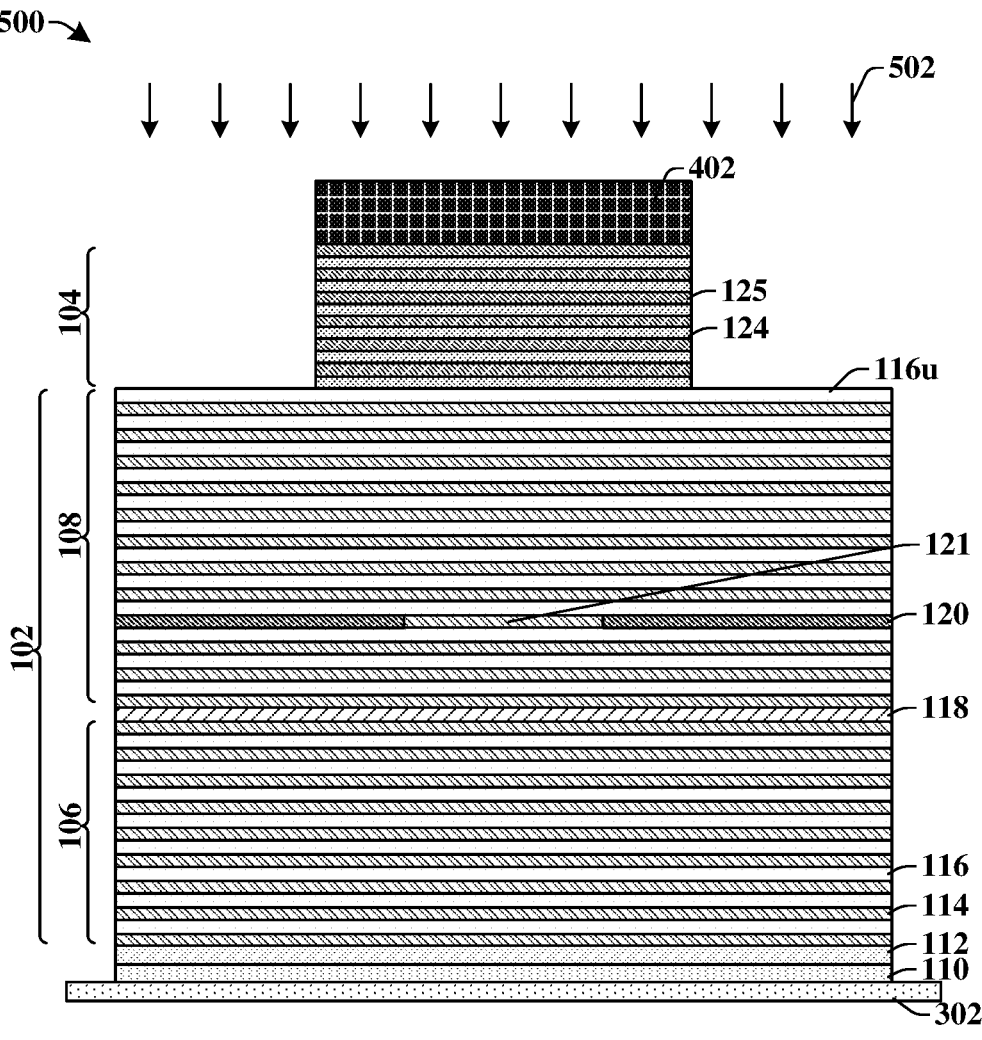

As shown in cross-sectional view 500 of FIG. 5, a first vertical etch process 502 may be performed to remove the outer portions (404 of FIG. 4) of the microlens stack 104. In some embodiments, the first vertical etch process 502 is a dry etch process and may be controlled to remove each layer in the outer portions (404 of FIG. 4) of the microlens stack 104. Thus, in some embodiments, the first vertical etch process 502 may be controlled to stop at an uppermost one 116u of the second reflector layers 116 in the reflector stack 102. For example, in some embodiments, the first vertical etch process 502 may comprise a dry etching processes that utilizes chlorine and fluorine gases to remove outer portions of each lens layer 124 and outer portions of each additional second reflector layer 125 in the microlens stack 104. After the first vertical etch process 502, the remaining microlens stack 104 may be substantially centered over the optical aperture 121 in the focusing layer 120.

As shown in cross-sectional view 600A of FIG. 6A, an oxidation process 602 may be performed to form oxidized lens layers 126 surrounding the lens layers 124. In some embodiments, the oxidation process 602 may be a wet oxidation process which uses water at a high temperature. In some embodiments, the high temperature is at least 400 degrees Celsius. In other embodiments, the oxidation process 602 may be a deep hydrofluoric wet oxidation process. The oxidation process 602 utilizes wet solutions to effectively oxidize the lens layers 124 in the lateral direction. Because the lens layers 124 comprise the first element that is susceptible to oxidation, but the additional second reflector layers 125 do not comprise the first element or any element susceptible to oxidation, peripheral portions of the lens layers 124 oxidize to form oxidized lens layers 126, whereas the additional second reflector layers 125 remain substantially unaffected by the oxidation process 602.

In some embodiments, the oxidation process 602 may effectively oxidize the lens layers 124 at the same time, but at different rates. The rate of oxidation increases from the bottommost lens layer 124b to the topmost lens layer 124t due to the concentration gradient of the first element in the lens layers 124. Further, because each lens layer 124 has a concentration gradient from a bottom surface to a top surface of each lens layer 124, the bottom surface is wider than the top surface of each lens layer 124. In some embodiments, sides of the lens layers 124 may be substantially curved or planar from the perspective of the cross-sectional view 600A, for example.

In some embodiments, the rate of oxidation of the first element exponentially increases with the concentration of the first element, whereas in other embodiments, the rate of oxidation of the first element linearly increases with the concentration of the first element, depending on the relationship between the first element and the wet solution. The additional second reflector layers 125 act as a barrier to prevent the oxidation process 602 from oxidizing top and bottom surfaces of the lens layers 124. Further, the uppermost one 116u of the second reflector layers 116 protects the upper and lower DBR regions 108, 106 from the oxidation process 602. In some embodiments, the additional second reflector layers 125 and the lens layers 124 are clear or transparent. In some embodiments, the oxidized lens layers 126 may be clear, and in other embodiments, the oxidized lens layers 126 may be translucent. The oxidized lens layers 126 may comprise aluminum oxide after the oxidation process 602, which has a refractive index of approximately 1.8. The oxidized lens layers 126 may also comprise gallium arsenide, in some embodiments, such that the composition of the oxidized lens layers 126 may be aluminum oxide gallium arsenide. The refractive index of the oxidized lens layers 126 may be different than the additional second reflector layers 125 and the lens layers 124 to effectively guide the light and produce a focused laser.

Cross-sectional view 600B of FIG. 6B illustrates some embodiments of the oxidized lens layers 126 and the additional second reflector layers 125 that may correspond to box A of FIG. 6A. In some embodiments, the oxidized lens layers 126 may laterally protrude outward past outermost sidewalls 125s of the additional second reflector layers 125 due to expansion from the oxidation process (602 of FIG. 6A). In some embodiments, an upper one of the oxidized lens layers 126 may have an outermost sidewall that protrudes outward past outermost sidewalls 125s of the additional second reflector layers 125 by a first distance $d_1$. A middle one of the oxidized lens layers 126 may have an outermost sidewall that protrudes outward past outermost sidewalls 125s of the additional second reflector layers 125 by a second distance $d_2$ that is less than the first distance $d_1$. A lower one of the oxidized lens layers 126 may have an outermost sidewall that protrudes outward past outermost sidewalls 125s of the additional second reflector layers 125 by a third distance $d_3$ less than the first distance $d_1$ and the second distance $d_2$. Thus, the expansion of the oxidized lens layers 126 may increase with a rate of oxidation of each lens layer (124 of FIG. 6A). In some embodiments, the outer sidewalls of the oxidized lens layers 126 may be rounded.

Cross-sectional view 600C of FIG. 6C illustrates some alternative embodiments of the oxidized lens layers 126 and the additional second reflector layers 125 that may correspond to box A of FIG. 6A. In some embodiments, the oxidized lens layers 126 may have outermost sidewalls 126s that are concave upward with respect to a bottom surface of the oxidized lens layers 126. In other words, in some embodiments, an upper one of the oxidized lens layers 126 may have an upper surface that protrudes past the outermost sidewalls 125s of the additional second reflector layers 125 by the first distance $d_1$, whereas an upper one of the oxidized lens layers 126 may have a lower surface that protrudes past the outermost sidewalls 125s of the additional second reflector layers 125 by a fourth distance $d_4$ that is less than the first distance $d_1$. Because of the concentration gradient of the first element in the lens layers (124 of FIG. 6A), the upper surface of each oxidized lens layer 126 may protrude past the outermost sidewalls 125s of the additional second reflector layers 125 more than the lower surface.

Figure 7:
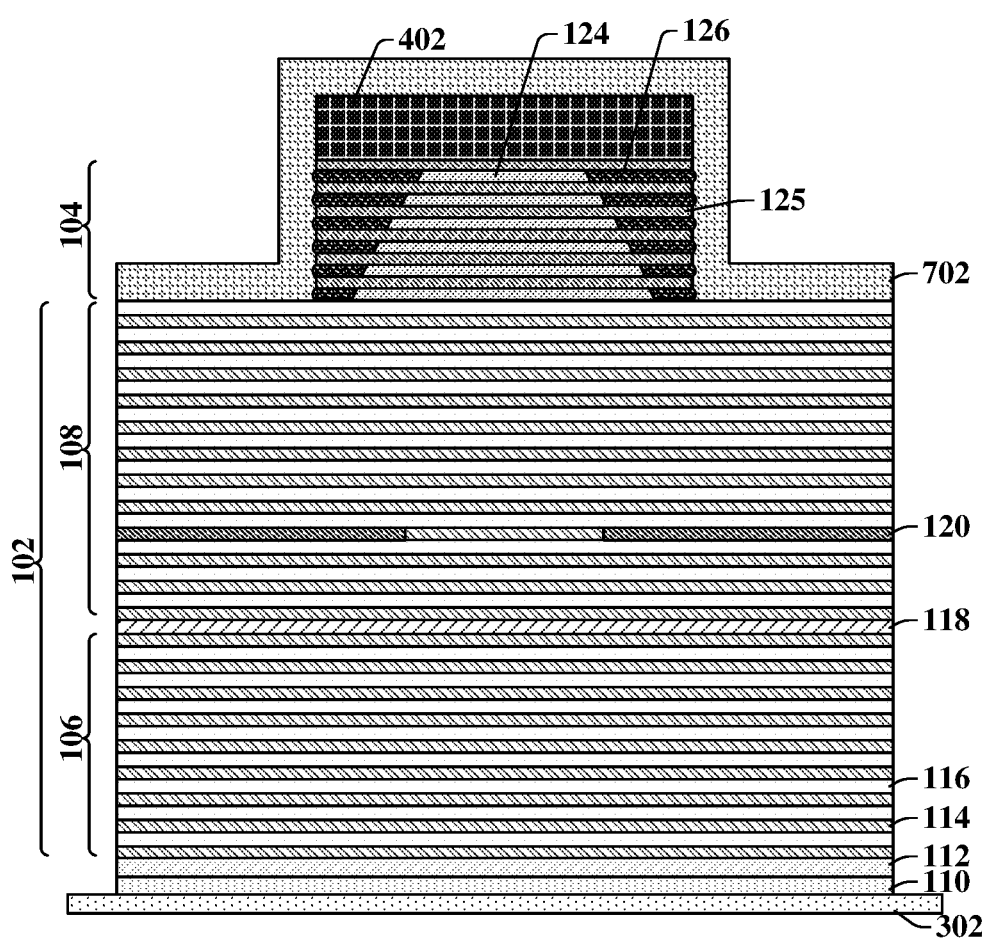

As shown in cross-sectional view 700 of FIG. 7, in some embodiments, a first spacer layer 702 may be deposited over the reflector stack 102, the microlens stack 104, and the masking layer 402. In some embodiments, the first spacer layer 702 comprises a dielectric, such as, for example, silicon nitride, silicon carbide, or the like. In some embodiments, the first spacer layer 702 may be deposited by a deposition technique (e.g., physical vapor deposition (PVD), chemical vapor deposition (CVD), PE-CVD, atomic layer deposition (ALD), etc.).

Figure 8:
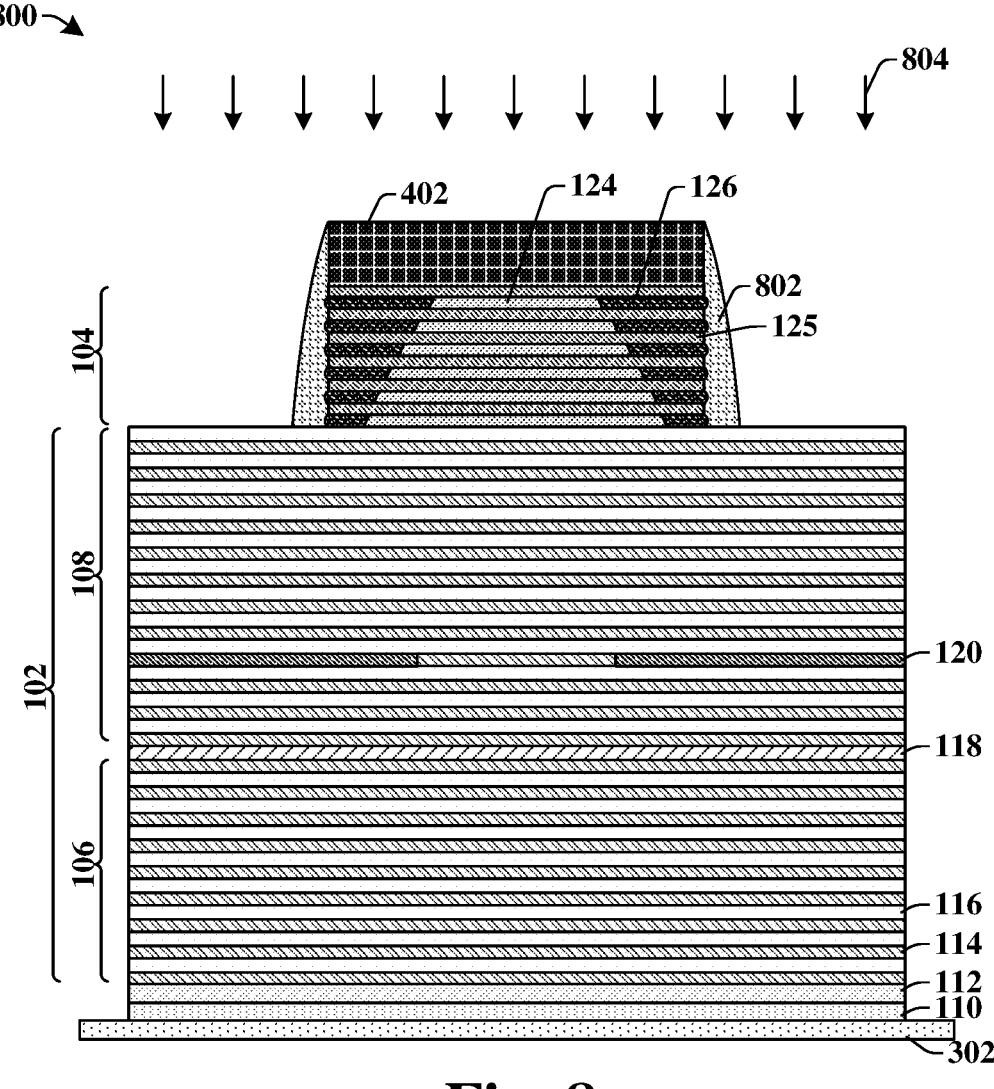

As shown in cross-sectional view 800 of FIG. 8, a second vertical etch process 804 may be performed in some embodiments that is selective to the first spacer layer (702 of FIG. 7) to form a first upper sidewall spacer 802. In some embodiments, the first upper sidewall spacer 802 has curved outer sidewalls because of the second vertical etch process 804.

Figure 9:
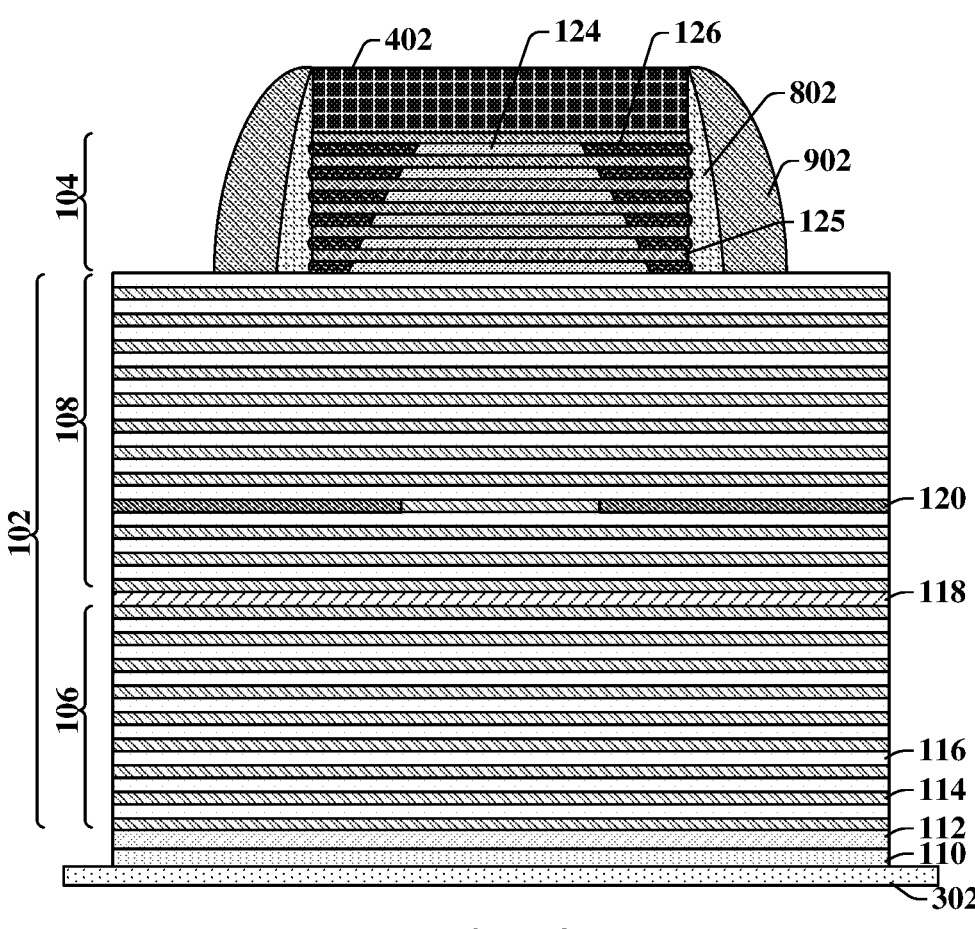

As shown in cross-sectional view 900 of FIG. 9, second upper sidewall spacers 902 may be formed beside the first upper sidewall spacers 802. In some embodiments, the second upper sidewall spacers 902 may be formed using similar steps as in FIGS. 7 and 8 regarding the formation of the first upper sidewall spacers 802. In some embodiments, the second upper sidewall spacers 902 are thicker than the first upper sidewall spacers 802. Further, in some embodiments, the second upper sidewall spacers 902 may comprise a different material than the first upper sidewall spacers 802. For example, in some embodiments, the second upper sidewall spacers 902 may comprise silicon dioxide, silicon oxynitride, or the like.

Figure 10:
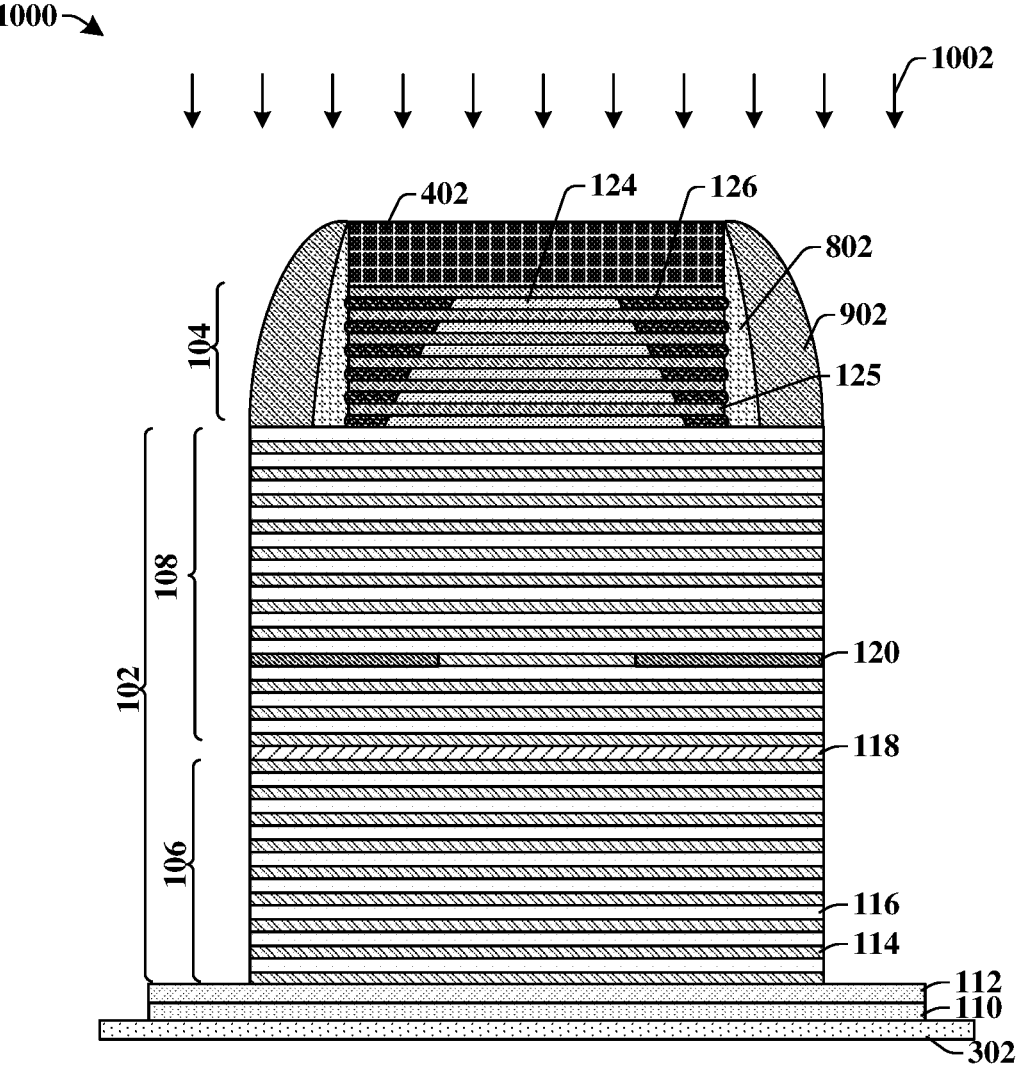

As shown in cross-sectional view 1000 of FIG. 10, in some embodiments, a third vertical etch process 1002 may be performed in some embodiments to remove peripheral portions of the reflector stack 102 that are uncovered by the microlens stack 104, the first upper sidewall spacers 802, and the second upper sidewall spacers 902. Thus, in some embodiments, the third vertical etch process 1002 may use the masking layer 402 and the second upper sidewall spacers 902 as a mask. The third vertical etch process 1002 may leave the second conductive layer 112 substantially unchanged.

Figure 11:
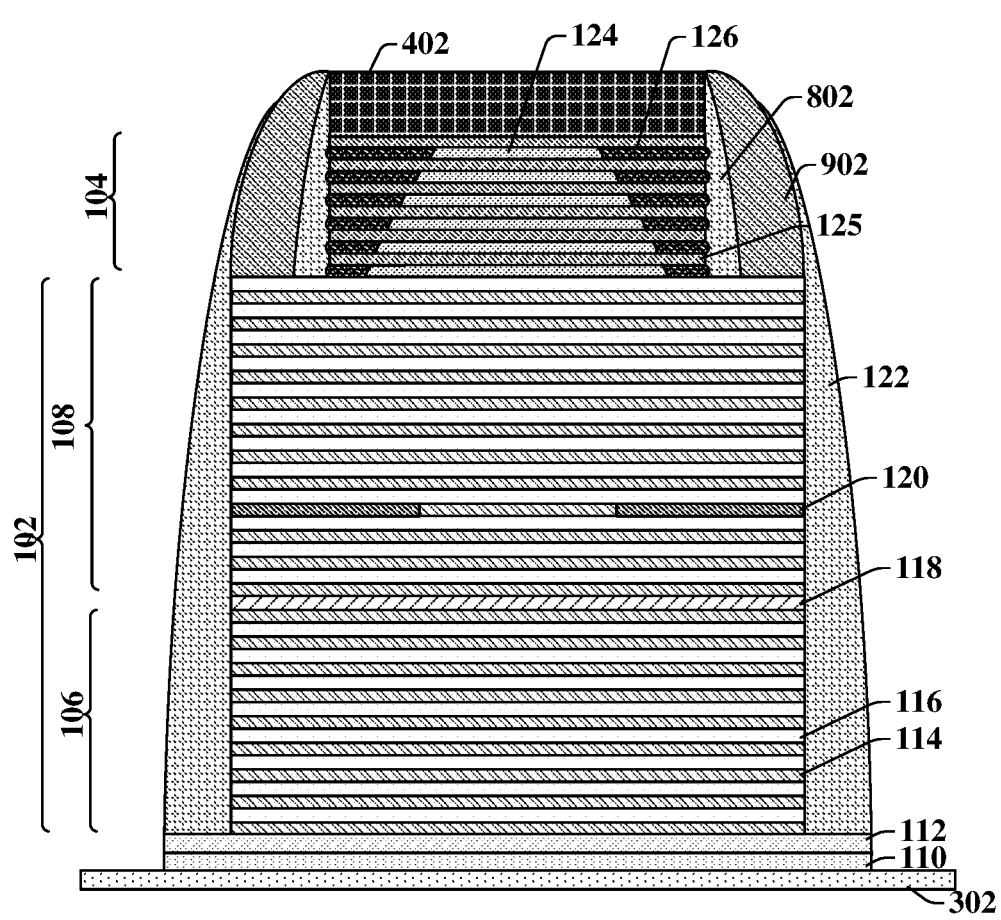

As shown in cross-sectional view 1100 of FIG. 11, lower sidewall spacers 122 may be formed over the reflector stack 102 and along the second upper sidewall spacers 902. The lower sidewall spacers 122 may be formed using similar steps as in FIGS. 7 and 8 regarding the formation of the first upper sidewall spacers 802. In some embodiments, the lower sidewall spacers 122 may comprise a dielectric material, such as silicon nitride, silicon carbide, or the like. Thus, in some embodiments, the lower sidewall spacers 122 may comprise a same material as the first upper sidewall spacers 802.

Figure 12:
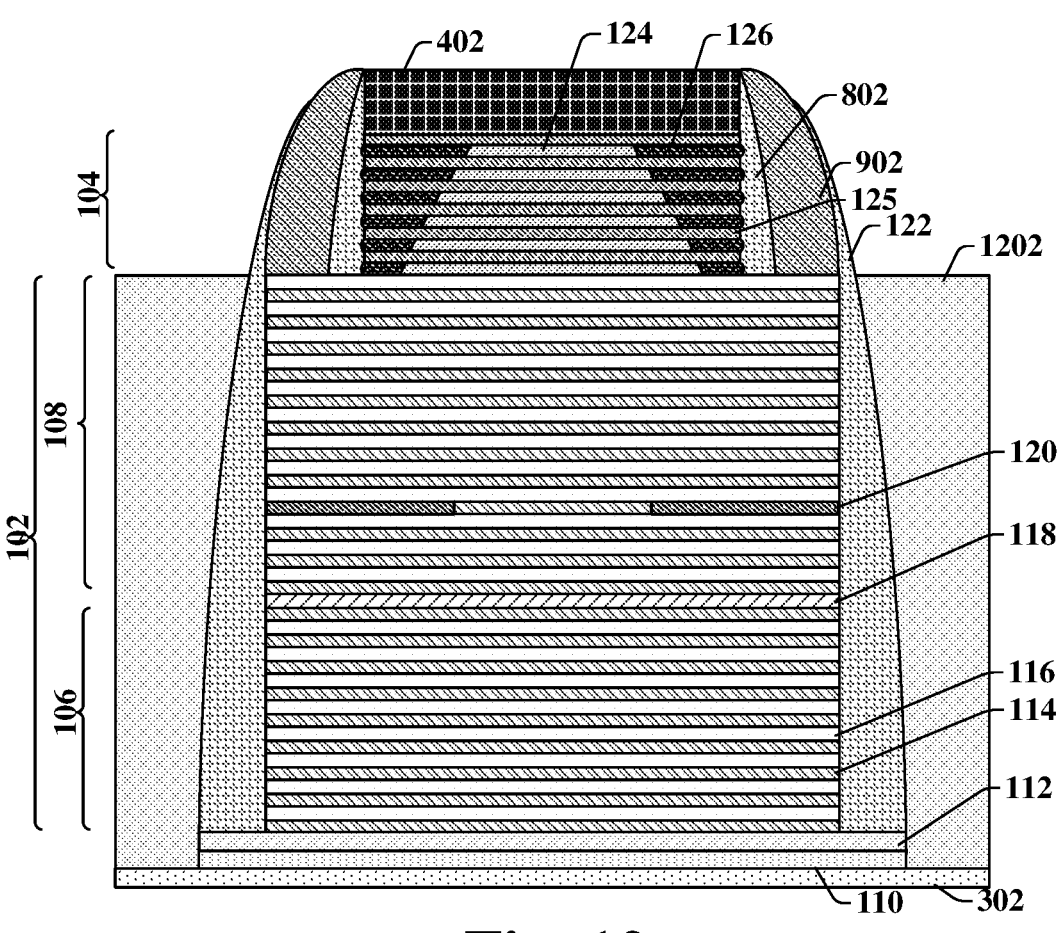

As shown in cross-sectional view 1200 of FIG. 12, in some embodiments, a molding layer 1202 may be formed around the lower sidewall spacers 122. In some embodiments, the molding layer 1202 may have a top surface that is substantially coplanar with a top surface of the reflector stack 102. In other embodiments, the molding layer 1202 may have a top surface that is above or below a top surface of the reflector stack 102. Further, in some embodiments, the molding layer 1202 may comprise a photoresist or another polymer material.

Figure 13:
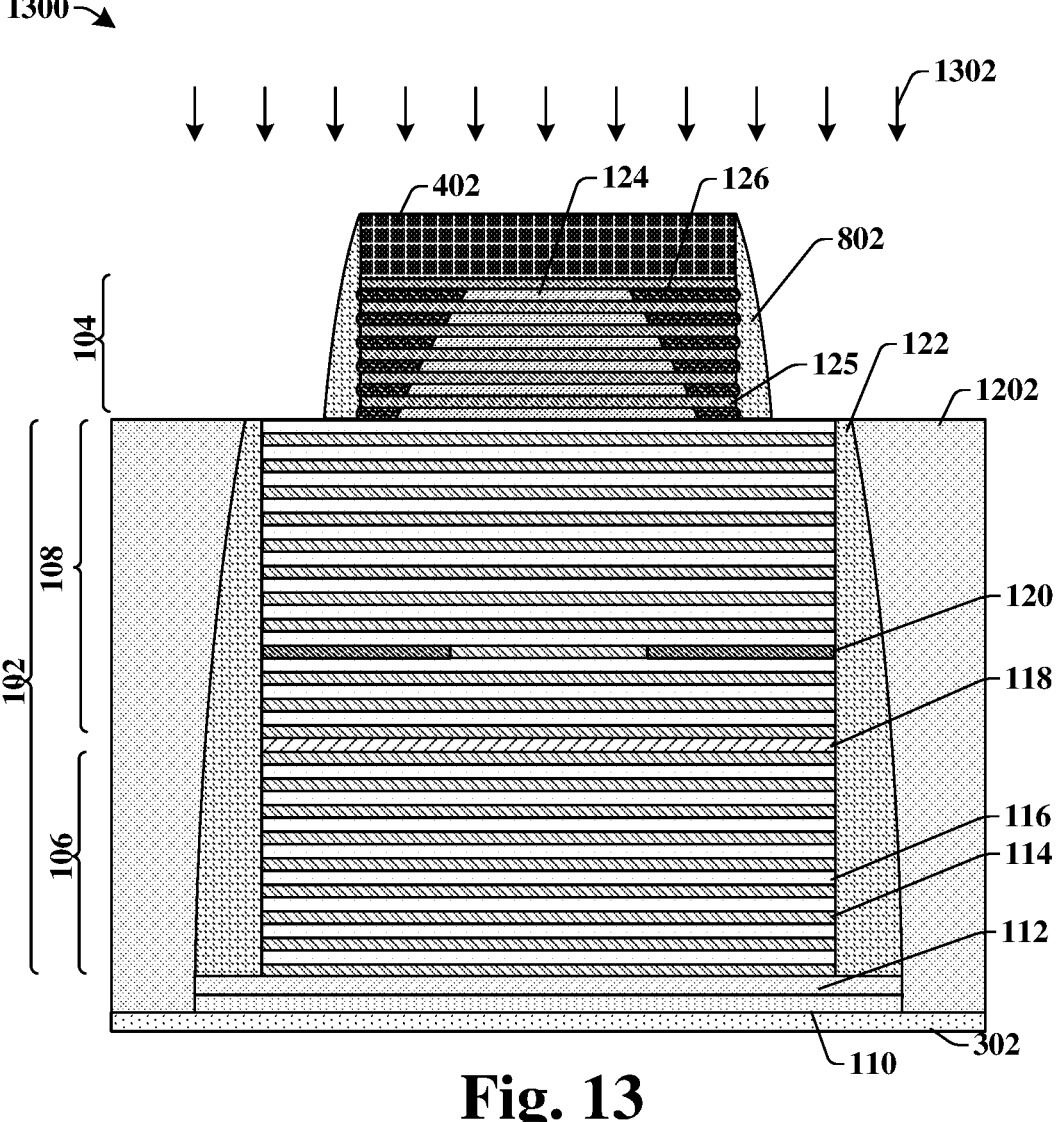

As shown in cross-sectional view 1300 of FIG. 13, a fourth vertical etch process 1302 may be performed to remove the second upper sidewall spacers (902 of FIG. 12) and upper portions of the lower sidewall spacers 122. The fourth vertical etch process 1302, in some embodiments, may utilize a dry etchant, such as hydrofluoric gas, for example. In some embodiments, after the fourth vertical etch process 1302, the lower sidewall spacers 122 have upper surfaces that are substantially coplanar with a top surface of the reflector stack 102. In other embodiments (not shown), after the fourth vertical etch process 1302, a small amount of the lower sidewall spacers 122 may be removed (so that the lower sidewall spacers 122 are recessed below the top surface or the reflector stack 102). In yet other embodiments (not shown), after the fourth vertical etch process 1302 a small amount of the second upper sidewall spacers (902 of FIG. 12) may remain over the top surface or the reflector stack 102 and be recessed below a top of the first upper sidewall spacers 802.

Figure 14:
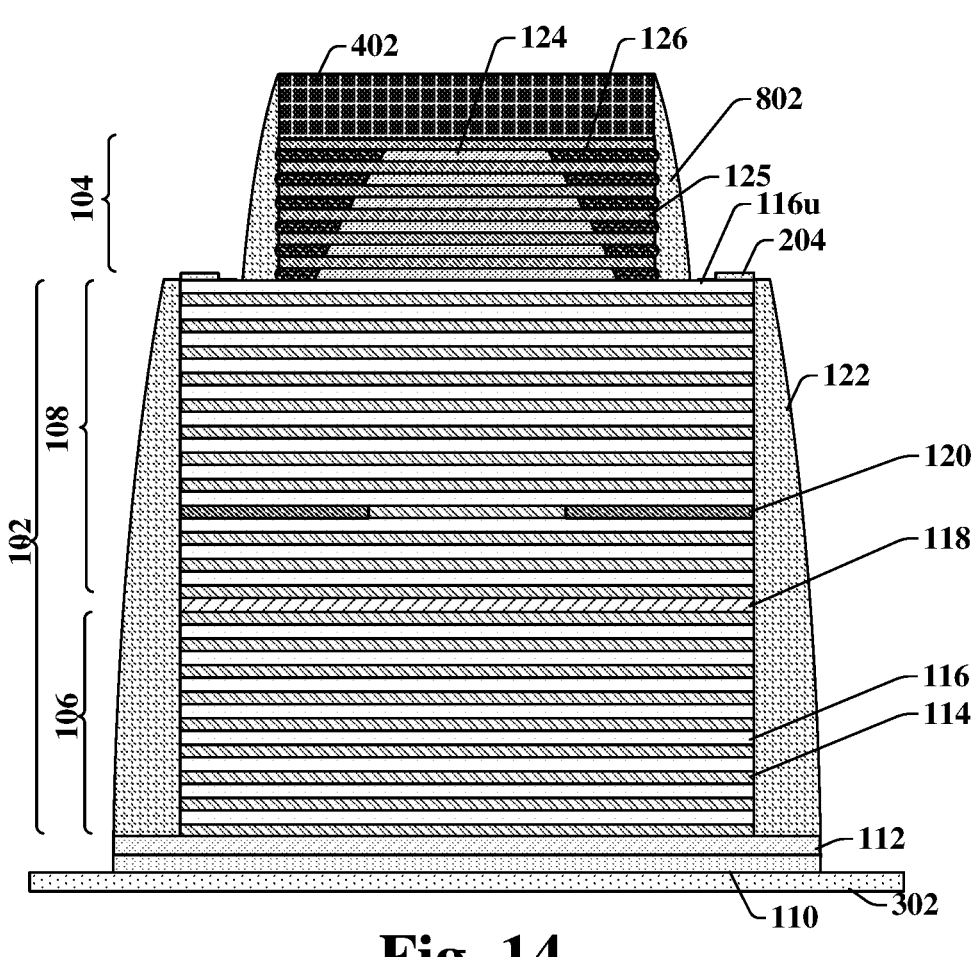

As shown in cross-sectional view 1400 of FIG. 14, in some embodiments, the molding layer (1202 of FIG. 13) may be removed by stripping, and a top electrode contact 204 may be formed on an uppermost one 116u of the second reflector layers 116 in the reflector stack 102. In some embodiments, from a top-view perspective the top electrode contact 204 is a continuous ring over the uppermost one 116u of the second reflector layers 116 and surrounding the microlens stack 104. In some embodiments, the top electrode contact 204 may comprise a conductive material, such as nickel, gold, copper, or the like. In some embodiments, the top electrode contact 204 comprises a same material as the first conductive layer 110. Further, in some embodiments, the top electrode contact 204 may be formed by a deposition technique (e.g., PVD, CVD, PE-CVD, sputtering, ALD, etc.).

Figure 15:
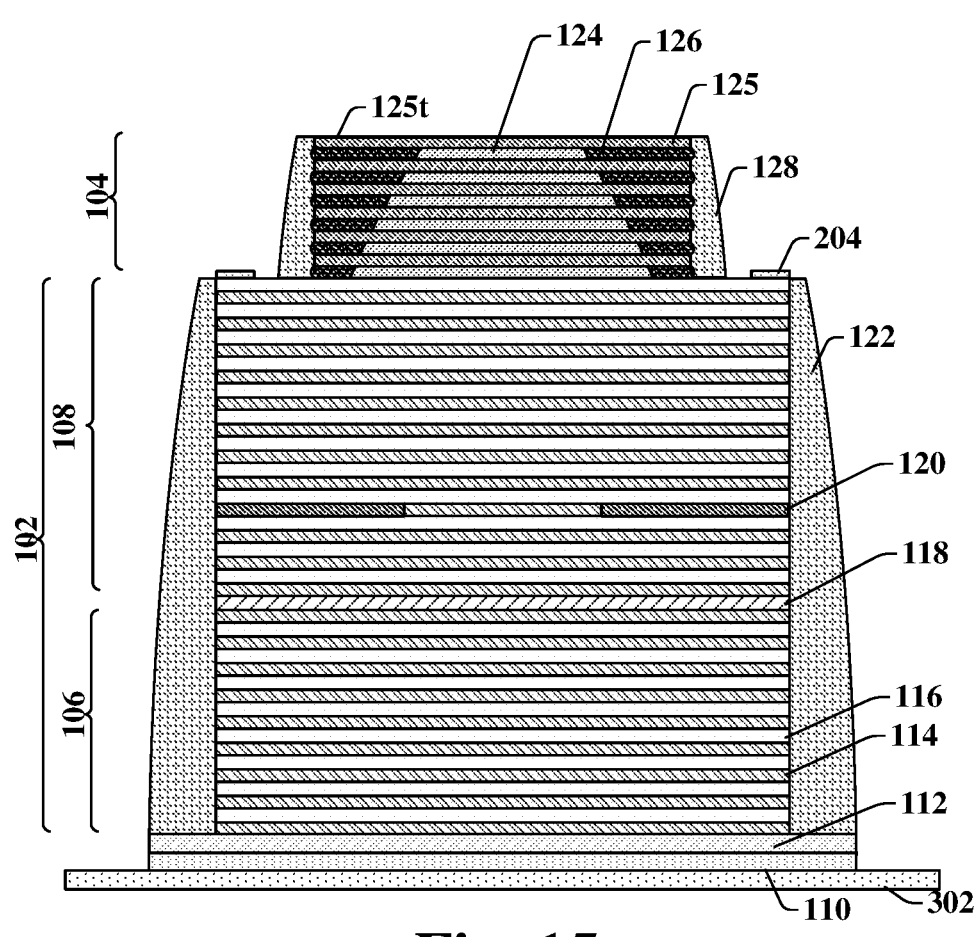

As shown in cross-sectional view 1500 of FIG. 15, in some embodiments, the masking layer (402 of FIG. 14) may be removed. In some embodiments, the masking layer (402 of FIG. 14) is removed by a planarization process (e.g., chemical mechanical planarization (CMP)), and thus, upper portions of the first upper sidewall spacers (802 of FIG. 14) are removed, thereby forming upper sidewall spacers 128 that have a top surface substantially coplanar with a topmost one 125*t* of the additional second reflector layers 125. In other embodiments, the masking layer (402 of FIG. 14) may be transparent, and the steps of FIG. 15 may be omitted, thereby leaving the masking layer (402 of FIG. 14) in place as in FIG. 14. In yet other embodiments, the masking layer (402 of FIG. 14) may be removed by way of an etching process. In some such embodiments, the upper sidewall spacers 128 may extend over a top of the microlens stack 104.

Figure 16:
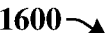
Figure 16:
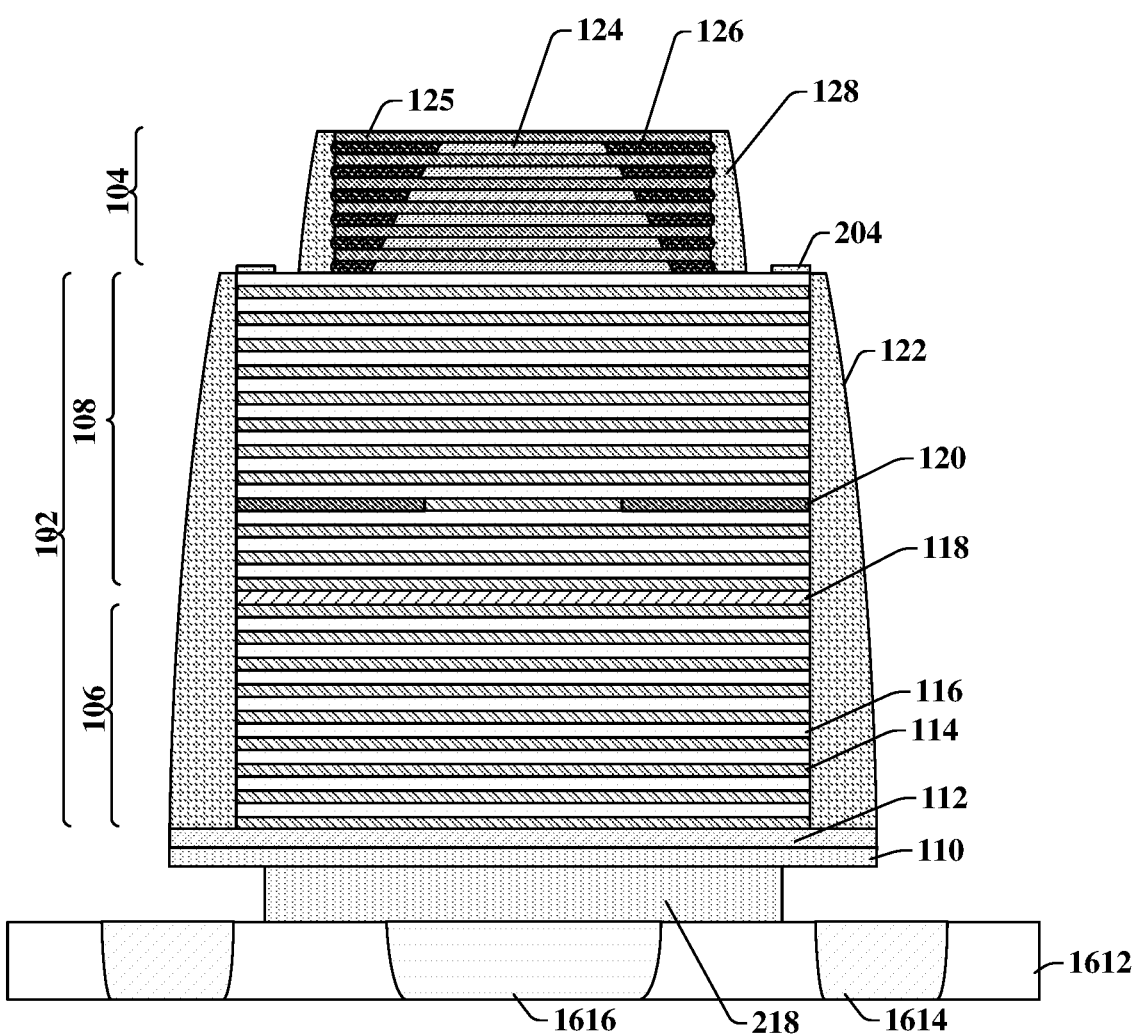

As shown in cross-sectional view 1600 of FIG. 16, the carrier substrate 302 may be removed and the first conductive layer 110 may be bonded to a bottom electrode 218. In some embodiments, the bottom electrode 218 may comprise a same material as the first conductive layer 110, such as nickel, for example. The bottom electrode 218 may have, in some embodiments, a thickness in a range of between, for example, approximately 0.5 micrometers and approximately 5 micrometers. In some embodiments, the bottom electrode 218 may already be bonded to a lower substrate structure 1612 when the first conductive layer 110 is bonded to the bottom electrode 218. The bottom electrode 218 may be coupled to a first device structure 1616 (e.g., transistor) in the lower substrate structure 1612. The lower substrate structure 1612 may also comprise a second device structure 1614 surrounding the first device structure 1616. In some embodiments, the first and second device structures 1616, 1614 supply a voltage bias across the reflector stack 102.

Figure 17:
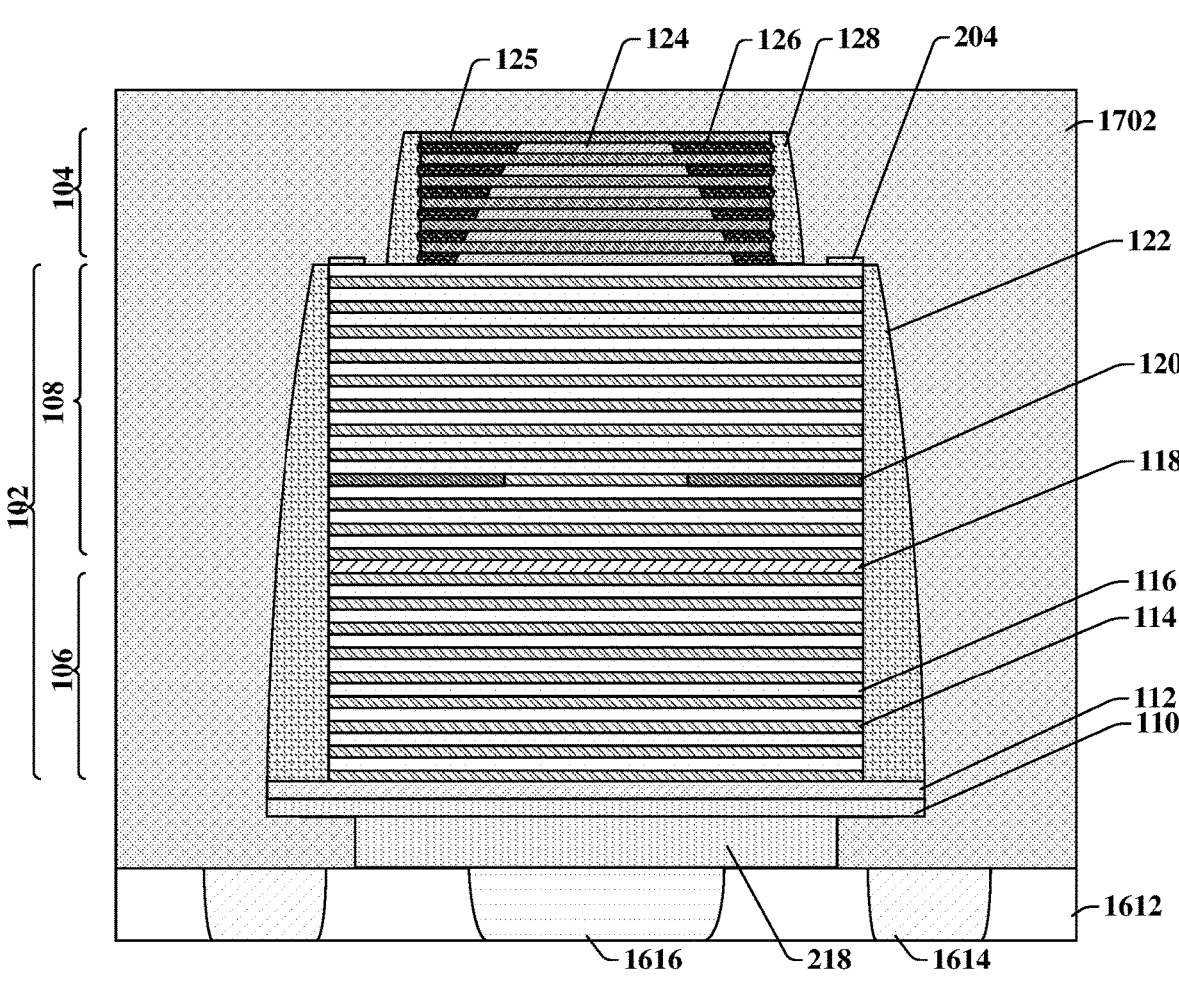

As shown in cross-sectional view 1700 of FIG. 17, in some embodiments, a dielectric structure 1702 may be deposited over the lower substrate structure 1612, the reflector stack 102, and the microlens stack 104. In some embodiments, the dielectric structure 1702 may comprise for example, nitride (e.g., silicon nitride, silicon oxynitride), a carbide (e.g., silicon carbide), an oxide (e.g., silicon oxide), borosilicate glass (BSG), phosphoric silicate glass (PSG), borophosphosilicate glass (BPSG), a low-k oxide (e.g., a carbon doped oxide, SiCOH), or the like. In some embodiments, the dielectric structure 1702 may be formed by a deposition technique (e.g., PVD, CVD, PE-CVD, sputtering, ALD, etc.).

Figure 18:
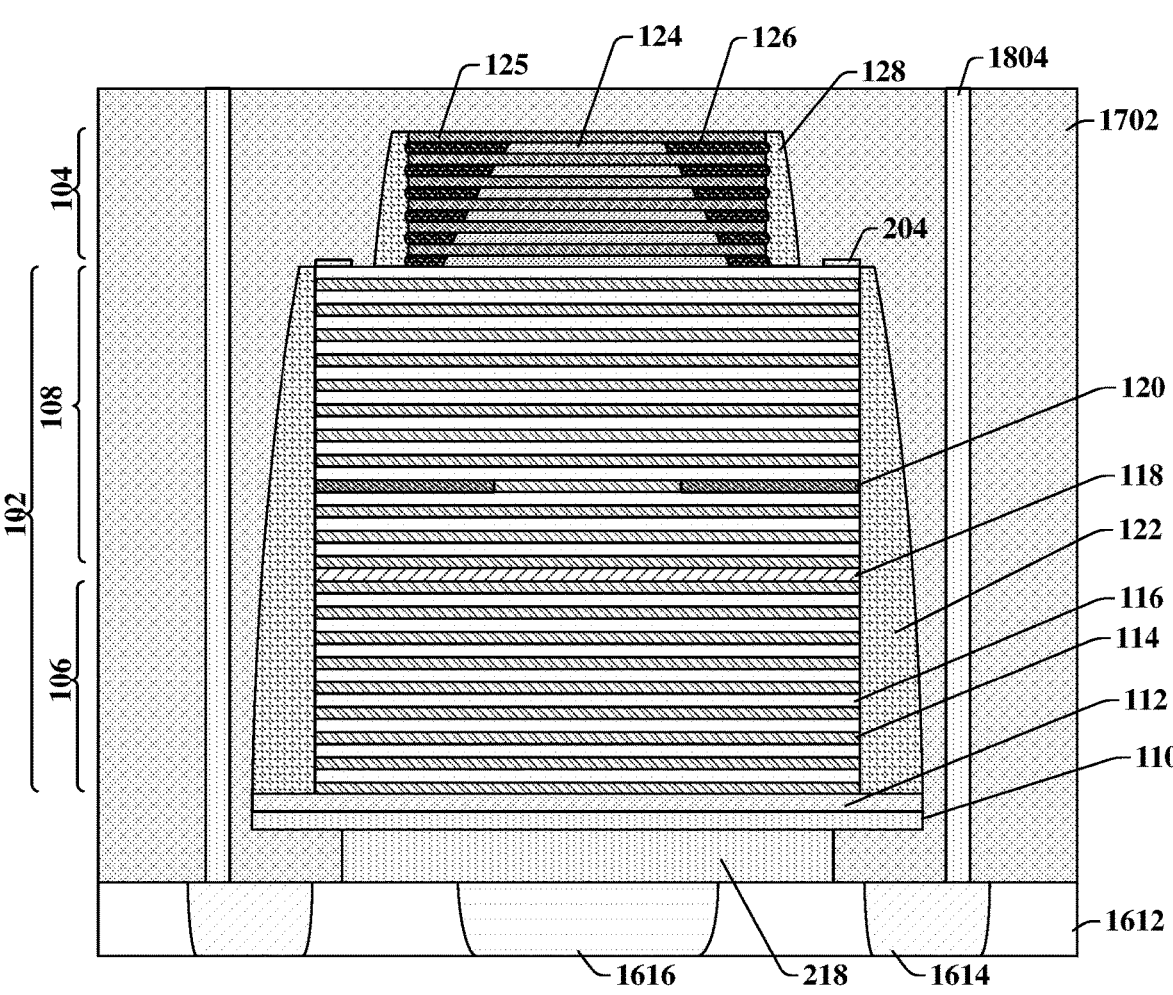

As shown in cross-sectional view 1800 of FIG. 18, a vertical contact via 1804 may be formed on either side of the reflector stack 102 and coupled to the second device structure 1614. In some embodiments, the vertical contact via 1804 may extend from a top surface of the dielectric structure 1702 to a top surface of the second device structure 1614. The vertical contact via 1804 may comprise a conductive material, such as copper, tungsten, aluminum, or the like, for example. In some embodiments, the vertical contact via 1804 may be formed by a damascene process, for example.

Figure 19:
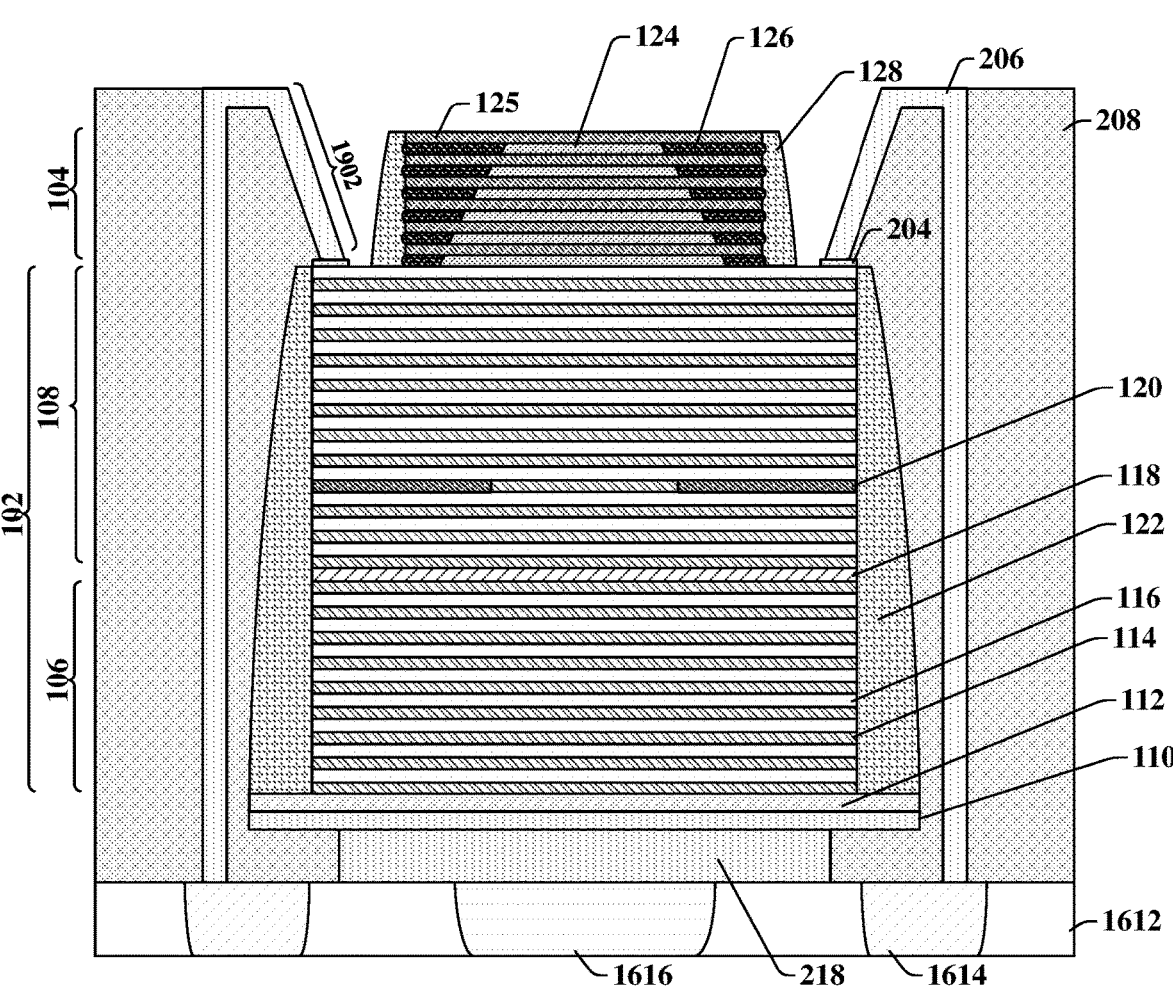

As shown in cross-sectional view 1900 of FIG. 19, a center portion of the dielectric structure (1702 of FIG. 18) may be removed, and connecting portions 1902 may be formed to couple the vertical contact via (1804 of FIG. 18) to the top electrode contact 204. Thus, the connecting portions 1902 and the vertical contact via (1804 of FIG. 18) may together be referred to as through conductive vias 206 that extend through an upper ILD structure 208 and couple the top electrode contact 204 to the second device structure 1614. Thus, in some embodiments, a bias may be applied across the reflector stack 102 through the top electrode contact 204 and the bottom electrode 218 to generate light from the optically active region 118, reflect the light through the first and second reflector layers 114, 116, and successfully guide the light through the optical aperture 121 and the lens layers 124 to emit a focused laser.

Figure 20:
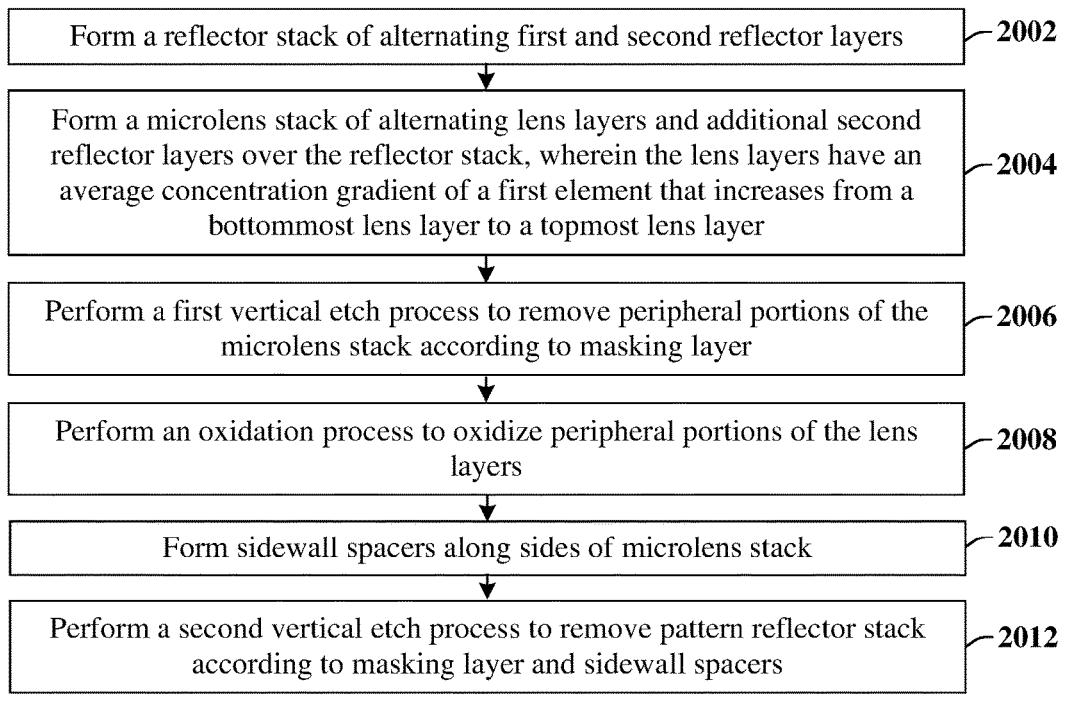
FIG. 20 illustrates a flow diagram of some embodiments of a method corresponding to FIGS. 3-19.

FIG. 20 illustrates a flow diagram of some embodiments of a method 2000 of forming a VCSEL device comprising a self-aligned microlens.

Although method 2000 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 2002, a reflector stack of alternating first and second reflector layers is formed.

At act 2004, a microlens stack of alternating lens layers and additional second reflector layers is formed over the reflector stack. The lens layers have an average concentration gradient of a first element that increases from a bottommost lens layer to a topmost lens layer. FIG. 3 illustrates a cross-sectional view 300 of some embodiments corresponding to acts 2002 and 2004.

At act 2006, a first vertical etch process is performed according to a masking layer to remove peripheral portions of the microlens stack. FIG. 5 illustrates a cross-sectional view 500 of some embodiments corresponding to act 2006.

At act 2008, an oxidation process is performed to oxidize peripheral portions of the lens layers. FIG. 6A illustrates a cross-sectional view 600A of some embodiments corresponding to act 2008.

At act 2010, one or more sidewall spacers are formed along sides of the microlens stack. FIGS. 7-9 illustrate cross-sectional views 700-900 of some embodiments corresponding to act 2010.

At act 2012, a second vertical etch process is performed according to the masking layer and the one or more sidewall spacers to pattern the reflector stack. FIG. 10 illustrates a cross-sectional view 1000 of some embodiments corresponding to act 2012.

Therefore, the present disclosure relates to a method of manufacturing a VCSEL device having a self-aligned microlens comprising lens layers having varying concentrations of a first element to increase the reliability of the VCSEL device to emit a focused laser.

Accordingly, in some embodiments, the present disclosure relates to a vertical cavity surface emitting laser (VCSEL) device, comprising: a reflector stack comprising alternating reflector layers of a first material and a second material; and a microlens stack arranged over the reflector stack and comprising: a first lens layer comprising a first average concentration of a first element and having a first width; a second lens layer arranged over the first lens layer and comprising a second average concentration of the first element greater than the first average concentration and having a second width smaller than the first width; and a third lens layer arranged over the second lens layer and comprising a third average concentration of the first element greater than the second average concentration and having a third width smaller than the second width.

In other embodiments, the present disclosure relates to a vertical cavity surface emitting layer (VCSEL) device, comprising: a reflector stack comprising a plurality of first reflector layers alternatingly stacked with a plurality of second reflector layers, wherein the plurality of first reflector layers comprise a first composition and the plurality of second reflector layers comprise a second composition different from the first composition; and a microlens stack comprising lens layers laterally surrounded by oxidized lens layers that laterally contact a sidewall spacer directly over the reflector stack, wherein the lens layers comprise: a bottommost lens layer having a first maximum width; an intermediate lens layer having a second maximum width less than the first maximum width; and a topmost lens layer having a third maximum width less than the second maximum width.

In yet other embodiments, the present disclosure relates to a method of making a microlens for a vertical cavity surface emitting laser (VCSEL) device, the method comprising: forming a first lens layer over a second reflector layer and comprising a first average concentration of a first element; forming a first additional reflector layer over the first lens layer; forming a second lens layer over the first additional reflector layer and comprising a second average concentration of the first element greater than the first average concentration; forming a second additional reflector layer over the second lens layer; and performing an oxidation process to oxidize peripheral portions of the first and second lens layers to form oxidized peripheral portions of the first lens layer and oxidized peripheral portions of the second lens layer, wherein the oxidized peripheral portions of the second lens layer are wider than the oxidized peripheral portions of the first lens layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of making a microlens for a vertical cavity surface emitting laser (VCSEL) device, the method comprising:

forming a first lens layer over a reflector layer and comprising a first average concentration of a first element and a first variable concentration of the first element, wherein the first lens layer continuously extends between a top surface and a bottom surface of the first lens layer, the first variable concentration changing between the top surface and the bottom surface;

forming a first additional reflector layer over the first lens layer;

forming a second lens layer over the first additional reflector layer and comprising a second average concentration of the first element greater than the first average concentration and a second variable concentration of the first element that is different than the first variable concentration;

forming a second additional reflector layer over the second lens layer;

performing an oxidation process to oxidize peripheral portions of the first and second lens layers to form oxidized peripheral portions of the first lens layer and oxidized peripheral portions of the second lens layer, wherein the oxidized peripheral portions of the second lens layer are wider than the oxidized peripheral portions of the first lens layer; and wherein a concentration of the first element at the top surface of the first lens layer is approximately equal to a concentration of the first element at a bottom surface of the second lens layer and different than a concentration of the first element at a top surface of the second lens layer.

2. The method of claim 1, further comprising:

performing an etch process according to a masking layer to remove outermost edges of the first lens layer, the first additional reflector layer, the second lens layer, and the second additional reflector layer, such that the reflector layer is wider than the first additional reflector layer, wherein the etch process is performed after forming the second additional reflector layer and before performing the oxidation process.

3. The method of claim 2, further comprising:

forming sidewall spacers along sidewalls of the masking layer, the first lens layer, the first additional reflector layer, the second lens layer, and the second additional reflector layer after performing the oxidation process.

4. The method of claim 3, further comprising:

forming the first lens layer over a reflector stack comprising an optically active region configured to generate electromagnetic radiation; and performing a second etch process to etch the reflector stack according to the sidewall spacers and the masking layer.

5. The method of claim 1, wherein the first lens layer has a higher concentration of the first element at an upper portion than at a lower portion, and wherein the upper portion undergoes the oxidation process at a higher rate than the lower portion.

6. The method of claim 1, wherein the oxidized peripheral portions of the first lens layer and the second lens layer laterally protrude outward past an outermost sidewall of the first additional reflector layer and the second additional reflector layer to different non-zero distances.

7. The method of claim 1, wherein the first variable concentration increases from the bottom surface of the first lens layer to the top surface of the first lens layer.

8. A method of making a microlens for a vertical cavity surface emitting laser (VCSEL) device, the method comprising:

forming a reflector stack comprising a plurality of first reflector layers alternatingly stacked with a plurality of second reflector layers, wherein the plurality of first reflector layers comprise a first composition and the plurality of second reflector layers comprise a second composition different from the first composition;

forming a microlens stack comprising a plurality of lens layers alternatively stacked with a plurality of additional reflector layers;

performing a first etch process according to a masking layer to remove outermost edges of the microlens stack;

performing an oxidation process to oxidize peripheral portions of the plurality of lens layers after the first etch process, wherein the oxidized peripheral portions increase in width as a distance over the reflector stack increases;

forming one or more upper sidewall spacers along sidewalls of the masking layer and the microlens stack;

performing a second etch process to etch the reflector stack after performing the oxidation process, the second etch process etching the reflector stack with the masking layer and the one or more upper sidewall spacers in place;

forming one or more lower sidewall spacers along sidewalls of the reflector stack after the second etch process;

forming a molding layer on outermost sidewalls of the one or more lower sidewall spacers, wherein the one or more lower sidewall spacers have an exposed part that protrudes outward from a top surface of the molding layer;

removing the exposed part, but not all, of the one or more lower sidewall spacers after the second etch process is completed and removing a part, but not all, of the one or more upper sidewall spacers after the second etch process is completed;

removing the molding layer after removing the exposed part of the one or more lower sidewall spacers; and forming top electrode contacts onto a top of the reflector stack and laterally between an outermost sidewall of the reflector stack and the one or more upper sidewall spacers after removing the part of the one or more upper sidewall spacers.

9. The method of claim 8, wherein the microlens stack comprises:

a first lens layer;

a first additional reflector layer over the first lens layer; and a second lens layer over the first additional reflector layer, wherein a concentration of a first element at a top surface of the first lens layer is approximately equal to the concentration of the first element at a bottom surface of the second lens layer and different than a concentration of the first element at a top surface of the second lens layer.

10. The method of claim 8, wherein the reflector stack comprises:

a focusing layer comprising interior sidewalls that face and laterally surround one or more of the first reflector layers or the second reflector layers, the interior sidewalls being directly below the microlens stack after the first etch process; and an active layer vertically separated from the focusing layer by one or more of the first reflector layers and the second reflector layers, the active layer laterally extending past the interior sidewalls of the focusing layer.

11. The method of claim 8, wherein the top electrode contacts are symmetric about a center of the microlens stack in a cross-sectional view.

12. The method of claim 8, wherein the molding layer laterally contacts the outermost sidewalls of the one or more lower sidewall spacers and vertically extends below a bottommost surface of the one or more lower sidewall spacers.

13. The method of claim 8, further comprising:

forming a dielectric structure laterally surrounding the one or more lower sidewall spacers, the reflector stack, and the microlens stack after performing the second etch process, wherein the dielectric structure vertically and physically contacts one of the additional reflector layers; and forming a vertical contact via extending from a top of the dielectric structure to a bottom of the dielectric structure, wherein the vertical contact via comprises a sidewall that is laterally separated from the microlens stack and that vertically extends from below a topmost surface of the microlens stack to above the topmost surface of the microlens stack.

14. The method of claim 13, further comprising:

removing a central portion of the dielectric structure from over the microlens stack; and forming a connecting portion along a sidewall of the dielectric structure, wherein the connecting portion couples the vertical contact via to one of the top electrode contacts formed on the top of the reflector stack.

15. The method of claim 8, wherein the reflector stack comprises a first layer comprising aluminum gallium arsenic and a second layer comprising indium gallium arsenide.

16. A method of making a microlens for a vertical cavity surface emitting laser (VCSEL) device, the method comprising:

forming a reflector stack comprising a plurality of first reflector layers alternately stacked with a plurality of second reflector layers;

forming a microlens stack comprising a plurality of lens layers alternately stacked with a plurality of additional reflector layers, wherein the plurality of lens layers have variable concentrations of a first element, and wherein concentrations of the first element at a top surface and a bottom surface of closest neighboring ones of the plurality of lens layers are approximately equal;

performing a first etch process according to a masking layer to remove outermost edges of the microlens stack;

performing an oxidation process to oxidize peripheral portions of the plurality of lens layers after the first etch process, wherein the oxidized peripheral portions increase in width as a distance over the reflector stack increases;

forming one or more upper sidewall spacers along opposing sides of the microlens stack after performing the oxidation process;

performing a second etch process to etch the reflector stack;

forming one or more lower sidewall spacers continuously extending from a conductive layer below the reflector stack, to along a side of the reflector stack, and to along a sidewall of the one or more upper sidewall spacers; and removing a part of the one or more lower sidewall spacers and a part of the one or more upper sidewall spacers after forming the one or more lower sidewall spacers.

17. The method of claim 16, further comprising:

forming a top electrode contact over a top of the reflector stack and along a side of the microlens stack; and forming a vertical contact via onto the top electrode contact, wherein the vertical contact via comprises a first sidewall that is laterally separated from the microlens stack and that vertically extends from below a topmost surface of the microlens stack to above the topmost surface of the microlens stack and an opposing second sidewall that vertically extends from over the topmost surface of the microlens stack to below a bottom of the reflector stack.

18. The method of claim 16, further comprising:

forming a molding compound around the one or more lower sidewall spacers, wherein the one or more lower sidewall spacers protrude outward above a top of the molding compound;

performing a third etch process with the molding compound in place to remove the part of the one or more lower sidewall spacers; and removing the molding compound.

19. The method of claim 16, wherein the oxidation process causes the lens layers to collectively form a microlens configured to focus radiation generated within the reflector stack, the microlens extending to a top of the one or more upper sidewall spacers.

20. The method of claim 16, wherein the one or more upper sidewall spacers comprise a first material and a second material covering an outer sidewall of the first material; and wherein removing the part of the one or more upper sidewall spacers removes the second material, the first material remaining along the opposing sides of the microlens stack after removing the part of the one or more upper sidewall spacers.

\* \* \* \* \*